(12) United States Patent
Kim

(10) Patent No.: US 9,455,235 B2
(45) Date of Patent: Sep. 27, 2016

(54) THIN EMBEDDED PACKAGES, METHODS OF FABRICATING THE SAME, ELECTRONIC SYSTEMS INCLUDING THE SAME, AND MEMORY CARDS INCLUDING THE SAME

(71) Applicant: SK HYNIX INC., Icheon (KR)

(72) Inventor: Seung Jee Kim, Seongnam (KR)

(73) Assignee: SK HYNIX INC., Icheon (KR)

( * ) Notice: Subject to any disclaimer, the term of this patent is extended or adjusted under 35 U.S.C. 154(b) by 16 days.

(21) Appl. No.: 14/247,023

(22) Filed: Apr. 7, 2014

(65) Prior Publication Data

US 2015/0145121 A1 May 28, 2015

(30) Foreign Application Priority Data

Nov. 25, 2013 (KR) ........................ 10-2013-0144116

(51) Int. Cl.
| | |
|---|---|
| *H01L 27/06* | (2006.01) |
| *H01L 23/00* | (2006.01) |
| *H01L 25/065* | (2006.01) |
| *H01L 23/13* | (2006.01) |

(52) U.S. Cl.
CPC ............... *H01L 24/11* (2013.01); *H01L 23/13* (2013.01); *H01L 24/19* (2013.01); *H01L 25/0657* (2013.01); *H01L 24/06* (2013.01); *H01L 2224/0401* (2013.01); *H01L 2224/04105* (2013.01); *H01L 2224/06155* (2013.01); *H01L 2224/12105* (2013.01); *H01L 2224/131* (2013.01); *H01L 2224/2919* (2013.01); *H01L 2224/32145* (2013.01); *H01L 2224/73217* (2013.01); *H01L 2924/12042* (2013.01)

(58) Field of Classification Search
None
See application file for complete search history.

(56) References Cited

U.S. PATENT DOCUMENTS

| | | | |
|---|---|---|---|
| 2003/0183917 A1* | 10/2003 | Tsai | H01L 23/3128 257/686 |
| 2005/0127508 A1* | 6/2005 | Lee | H01L 24/11 257/737 |
| 2010/0133704 A1* | 6/2010 | Marimuthu | H01L 21/565 257/778 |
| 2010/0144137 A1* | 6/2010 | Lee | H01L 21/76898 438/618 |
| 2012/0248439 A1* | 10/2012 | Lee | H01L 23/49838 257/48 |

FOREIGN PATENT DOCUMENTS

| | | |
|---|---|---|
| KR | 10-2006-0074091 A | 7/2006 |
| KR | 10-2011-0020547 A | 3/2011 |
| KR | 10-2011-0041301 A | 4/2011 |

* cited by examiner

Primary Examiner — Calvin Choi
Assistant Examiner — Xiaoming Liu

(57) ABSTRACT

An embedded package includes a core layer having a cavity, a first semiconductor chip disposed in the cavity, and bumps disposed on a top surface of the first semiconductor chip, a second semiconductor chip disposed on the first semiconductor chip and the core layer, pads disposed on a top surface of the second semiconductor chip, and a first insulation layer disposed on the core layer and the first and second semiconductor chips. The first insulation layer has first openings that expose the bumps and second openings that expose the pads, and the first and second openings have a similar depth.

16 Claims, 17 Drawing Sheets

→ Y DIRECTION

→ X DIRECTION

THIN EMBEDDED PACKAGES, METHODS OF FABRICATING THE SAME, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Patent Application No. 10-2013-0144116, filed on Nov. 25, 2013, in the Korean Intellectual Property Office, which is hereby incorporated by reference in its entirety.

BACKGROUND

1. Technical Field

Embodiments of the present disclosure relate to semiconductor packages and, more particularly, to thin embedded packages, methods of fabricating the same, electronic systems including the same, and memory cards including the same.

2. Related Art

Typical embedded packages include passive devices, such as devices that are embedded in a substrate. Recently, an embedded package may be fabricated by embedding an active device (e.g., a semiconductor chip, a digital integrated circuit, an analog integrated circuit, and so on) along with a passive device in a substrate.

SUMMARY

Various embodiments are directed to embedded packages, methods of fabricating the embedded packages, electronic systems including the embedded packages, and memory cards including the embedded packages.

According to some embodiments, an embedded package includes a core layer having a cavity, a first semiconductor chip disposed in the cavity, bumps disposed on a top surface of the first semiconductor chip, a second semiconductor chip disposed on the first semiconductor chip and the core layer, pads disposed on a top surface of the second semiconductor chip, and a first insulation layer disposed on the core layer and the first and second semiconductor chips having first openings that expose the bumps and second openings that expose the pads. The first and second openings have a similar depth.

According to further embodiments, an embedded package includes a core layer having a cavity, a first semiconductor chip disposed in the cavity, first bumps disposed on a top surface of the first semiconductor chip, a second semiconductor chip disposed on the first semiconductor chip and the core layer, bumps on a top surface of the second semiconductor chip, and a first insulation layer disposed on the core layer and the first and second semiconductor chips having first openings that expose the first bumps and second openings that expose the second bumps. The first and second openings have a similar depth.

According to further embodiments, a method of fabricating an embedded package includes providing a core layer having a cavity. A first semiconductor chip is placed in the cavity. The first semiconductor chip has bumps having a first height on a top surface. A second semiconductor chip is attached to top surfaces of the first semiconductor chip and the core layer. The second semiconductor chip has pads on a top surface. A thickness of the second semiconductor chip is substantially equal to the first height. A first insulation layer is formed on the core layer, the first semiconductor chip and the second semiconductor chip. Portions of the first insulation layer are selectively removed to form first openings that expose the bumps and second openings that expose the pads. The first and second openings are formed to have a similar depth.

According to further embodiments, a method of fabricating an embedded package includes providing a core layer having a cavity. A first semiconductor chip is placed in the cavity. The first semiconductor chip has first bumps of a first height on a top surface. A second semiconductor chip is attached onto top surfaces of the first semiconductor chip and the core layer. The second semiconductor chip has second bumps on a top surface. A thickness of the second semiconductor chip is substantially equal to the first height. A first insulation layer is formed on the core layer, the first semiconductor chip and the second semiconductor chip. Portions of the first insulation layer are selectively removed to form first openings that expose the first bumps and second openings that expose the second bumps. The first and second openings are formed to have a similar depth.

According to further embodiments, an electronic system includes a memory component and a controller coupled with the memory component through a bus. The memory component or the controller includes a core layer having a cavity, a first semiconductor chip disposed in the cavity, bumps disposed on a top surface of the first semiconductor chip, a second semiconductor chip disposed on the first semiconductor chip and the core layer, pads disposed on a top surface of the second semiconductor chip, and a first insulation layer disposed on the core layer and the first and second semiconductor chips having first openings that expose the bumps and second openings that expose the pads. The first and second openings have a similar depth.

According to further embodiments, an electronic system includes a memory component and a controller coupled with the memory component through a bus. The memory component or the controller includes a core layer having a cavity, a first semiconductor chip disposed in the cavity, first bumps disposed on a top surface of the first semiconductor chip, a second semiconductor chip disposed on the first semiconductor chip and the core layer, bumps on a top surface of the second semiconductor chip, and a first insulation layer disposed on the core layer and the first and second semiconductor chips having first openings that expose the first bumps and second openings that expose the second bumps. The first and second openings have a similar depth. According to further embodiments, a memory card includes a memory component and a memory controller that controls operation of the memory component. The memory component includes a core layer having a cavity, a first semiconductor chip disposed in the cavity, bumps disposed on a top surface of the first semiconductor chip, a second semiconductor chip disposed on the first semiconductor chip and the core layer, pads disposed on a top surface of the second semiconductor chip, and a first insulation layer disposed on the core layer and the first and second semiconductor chips having first openings that expose the bumps and second openings that expose the pads. The first and second openings have a similar depth.

According to further embodiments, a memory card includes a memory component and a memory controller that controls operation of the memory component. The memory component includes a core layer having a cavity, a first semiconductor chip disposed in the cavity, first bumps disposed on a top surface of the first semiconductor chip, a second semiconductor chip disposed on the first semiconductor chip and the core layer, bumps on a top surface of the second semiconductor chip, and a first insulation layer disposed on the core layer and the first and second semiconductor chips having first openings that expose the first bumps and second openings that expose the second bumps. The first and second openings have a similar depth.

BRIEF DESCRIPTION OF THE DRAWINGS

Embodiments of the present invention will become more apparent in view of the attached drawings and accompanying Detailed Description, in which.

DESCRIPTION OF SPECIFIC EMBODIMENTS

Figure 1:
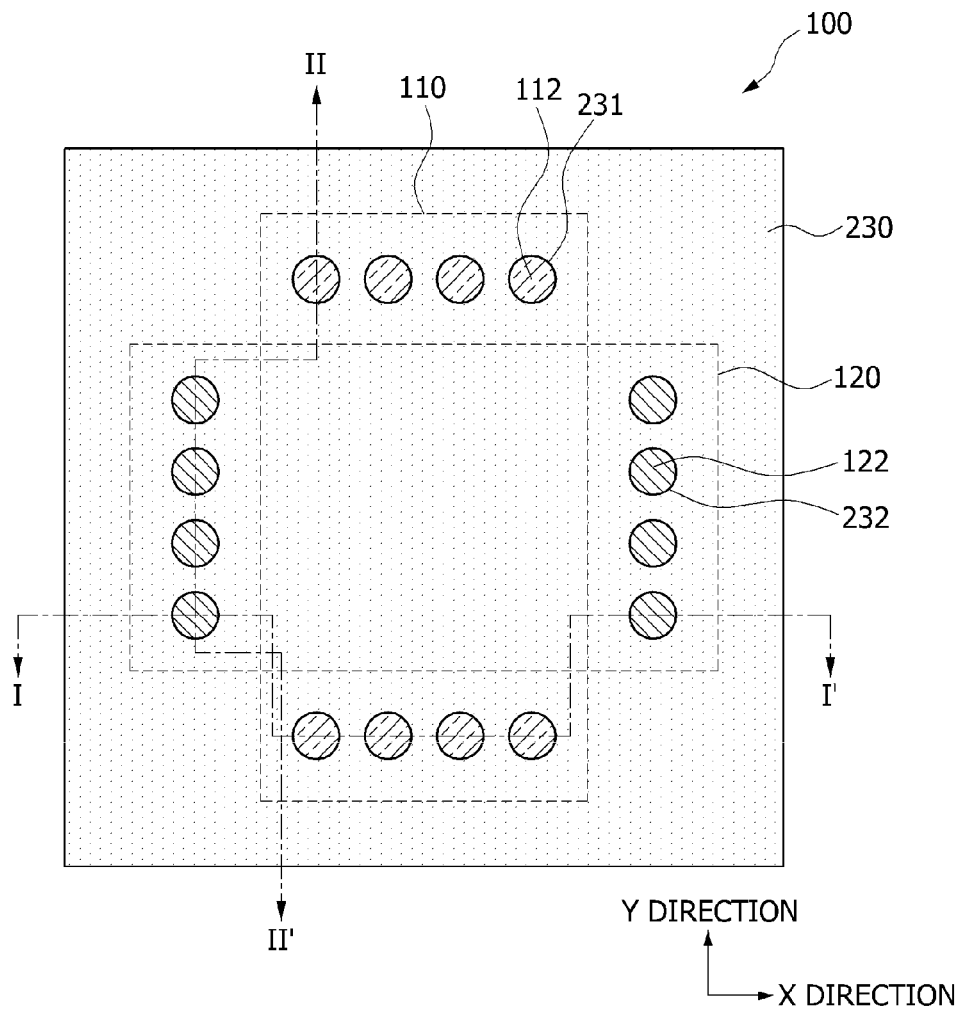
FIG. 1 is a plan view illustrating an embedded package according to some embodiments of the present invention.

FIG. 1 illustrates an embedded package 100 according to some embodiments. The embedded package 100 includes a first semiconductor chip 110 and a second semiconductor chip 120, which are stacked to cross each other such that the first semiconductor chip 110 is placed in an orientation that is rotated 90 degrees relative to a placed orientation of the second semiconductor chip 120. Although FIG. 1 illustrates two stacked semiconductor chips, the present invention is not limited to such an arrangement of chips. For example, in some embodiments, the embedded package 100, and other packages described herein, may include three or more stacked semiconductor chips. The second semiconductor chip 120 is stacked on or above the first semiconductor chip 110. In some embodiments, the first semiconductor chip 110 and/or the second semiconductor chip 120 may have a rectangular shape or other similar geometrical shape, where the length of the chip is greater than the width. For example, the first semiconductor chip 110 may be positioned such that the length of the chip 110 is in a Y direction and the width of the chip 110 is in an X direction, whereas the second semiconductor chip 120 may be positioned such that the length of the chip 120 in the X direction and the width of the chip 120 is in the Y direction, as illustrated in FIG. 1.

One or more bumps 112 may be disposed on a top surface of the first semiconductor chip 110. In some embodiments, the bumps 112 are disposed on two opposite ends of the first semiconductor chip 110, and are not covered by (e.g., are not directly below) the second semiconductor chip 120. The bumps 112 may be spaced apart from each other. In various embodiments, the arrangement, configuration, and/or number of the bumps 112 may vary or be selected based on a function of the first semiconductor chip 110. The two opposite ends of the top surface of the first semiconductor chip 110, on which the bumps 112 are disposed, are not directly below the second semiconductor chip 120 when the second semiconductor chip 120 is vertically stacked on or above the first semiconductor chip 110.

In some embodiments, one or more pads 122 are disposed on a top surface of the second semiconductor chip 120. In some embodiments, the pads 122 are disposed on two opposite ends of the second semiconductor chip 120 and are spaced apart from each other. In various embodiments, the arrangement, configuration and/or number of the pads 122 may vary or be selected based on a function of the second semiconductor chip 120.

In some embodiments, the bumps 112 of the first semiconductor chip 110 and the pads 122 of the second semiconductor chip 120 are disposed in a substantially similar configuration or arrangement. For example, as shown in FIG. 1, the bumps 112 are disposed on the two opposite ends of the first semiconductor chip 110 that are located along the Y direction, and the pads 122 are disposed on the two opposite ends of the second semiconductor chip 120 that are located along the X direction. The second semiconductor chip 120 is disposed on or above the first semiconductor chip 110 in a planar orientation that is rotated about 90 degrees with respect to the first semiconductor chip 110. Thus, the two opposite ends of the first semiconductor chip 110, where the bumps 112 are disposed, do not vertically overlap with the two opposite ends of the second semiconductor chip 120, where the pads 122 are disposed.

In some embodiments, the configuration or arrangement of the bumps 112 of the first semiconductor chip 110 is different from the configuration or arrangement of the pads 122 of the second semiconductor chip 120. For example, the bumps 112 may be disposed on the two opposite ends of the first semiconductor chip 110, and the pads 122 may be disposed on a central portion of the second semiconductor chip 120. Following the example, the two opposite ends of the first semiconductor chip 110, where the bumps 112 are disposed, do not vertically overlap (e.g., are not directly below) the second semiconductor chip 120, but the central portion of the second semiconductor chip 120, where the pads 122 are disposed, does vertically overlap (e.g., is above) the first semiconductor chip 110. Of course, other arrangements or configurations are possible. For example, in some embodiments, the first semiconductor chip 110 is disposed below the second semiconductor chip 120 such that the orientation of the first semiconductor chip 110 is rotated by an angle that is between 0 and 90 degrees relative to the orientation of the second semiconductor chip 120. In even such embodiments, the portions of the first semiconductor chip 110 where the bumps 112 are disposed do not directly overlap (e.g., may not be placed below) the second semiconductor chip 120.

In some embodiments, the first semiconductor chip 110 and the second semiconductor chip 120 are covered with a first insulation layer 230. The first insulation layer 230 may include one or more first openings 231 and one or more second openings 232. The first openings 231 may be formed to expose the bumps 112 of the first semiconductor chip 110, and the second openings 232 may be formed to expose the pads 122 of the second semiconductor chip 120. Thus, the number of the first openings 231 may be equal to the number of the bumps 112, and the number of the second openings 232 may be equal to the number of the pads 122. As illustrated in FIG. 1, each of the first and second openings 231 and 232 may have a circular cross-sectional shape. However, in some embodiments, each of the first and second openings 231 and 232 may have a diagonal or other non-circular cross-sectional shape.

Figure 2:
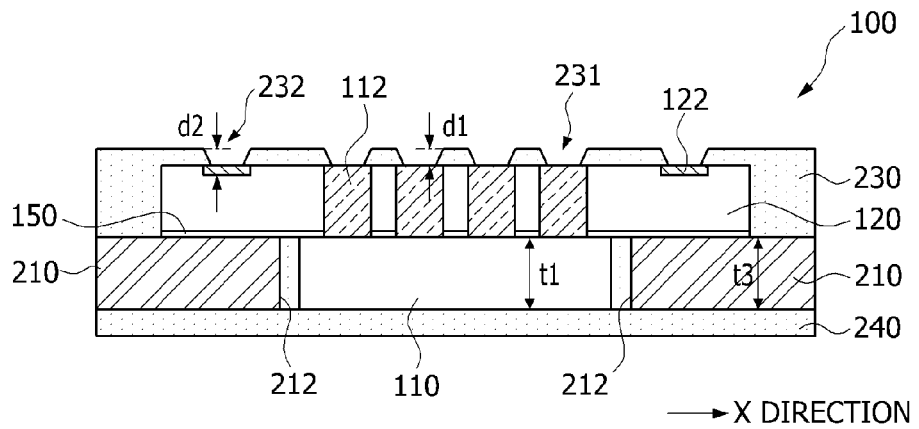
FIG. 2 is a cross-sectional view taken along line I-I' of FIG. 1.
Figure 3:
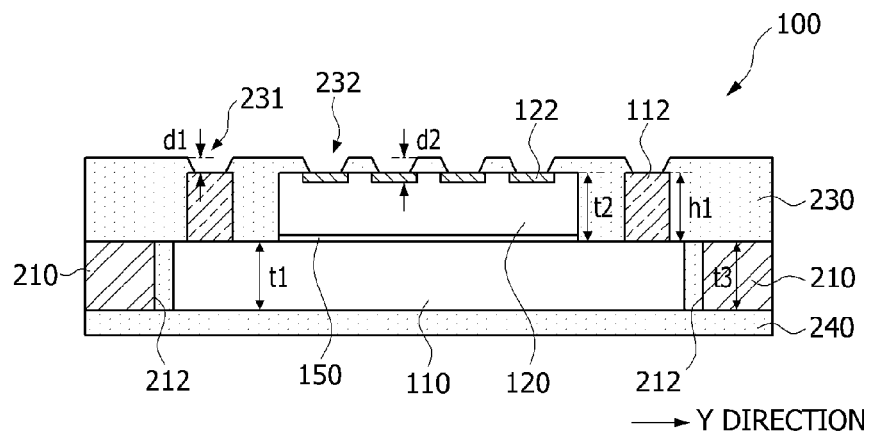
FIG. 3 is a cross-sectional view taken along line II-II' of FIG. 1.

Referring to FIGS. 2 and 3, the embedded package 100 includes a core layer 210 having a cavity 212. The cavity 212 may be disposed or formed in a central region of the core layer 210. The cavity 212 may have a planar area that is configured or shaped to receive the first semiconductor chip 110. In some embodiments, the planar area of the cavity 212 may be equal to or greater than a planar area of the first semiconductor chip 110. In some embodiments, a width of the cavity 212 in the X direction may be less than a width of the cavity 212 in the Y direction. The first semiconductor chip 110 may be disposed in the cavity 212.

In some embodiments, a thickness t3 of the core layer 210 may be substantially equal to a thickness t1 of the first semiconductor chip 110. Thus, a bottom surface and a top surface of the first semiconductor chip 110 may be coplanar with a bottom surface and a top surface of the core layer 210, respectively, when the first semiconductor chip 110 is disposed within the cavity 212. In some embodiments, the thickness t3 of the core layer 210 may be different from the thickness t1 of the first semiconductor chip 110. For example, the thickness t3 of the core layer 210 may be greater than or less than the thickness t1 of the first semiconductor chip 110. However, in even such embodiments, the top surface of the first semiconductor chip 110 is coplanar with the top surface of the core layer 210. The bumps 112 may be disposed on the two opposite ends of the first semiconductor chip 110, as described herein. A height h1 of each bump 112 may be substantially equal to a thickness t2 of the second semiconductor chip 120.

In some embodiments, the second semiconductor chip 120 is attached to the top surface of the first semiconductor chip 110 using an adhesive agent 150. As described in FIG. 1, the second semiconductor chip 120 may be disposed to vertically overlap the first semiconductor chip 110 in a different spatial orientation. Thus, the second semiconductor chip 120 may be disposed such that a portion of the second semiconductor chip 120 is on or above the first semiconductor chip 110 and other portions of the second semiconductor chip 120 are on or above the core layer 210, such that the other portions of the second semiconductor chip 120 are supported by the core layer 210.

In some embodiments, the pads 122 are disposed on the portions of the second semiconductor chip 120 on or above the core layer 210. The pads 122 may be formed to have top surfaces that are substantially coplanar with the top surface of the second semiconductor chip 120. In some embodiments, the bumps 112 disposed on the first semiconductor chip 110 are located proximate to sidewalls of the second semiconductor chip 120. Since the height h1 of bumps 112 may be substantially equal to the total thickness t2 of the second semiconductor chip 120 and the adhesive agent 150, the top surfaces of the bumps 112 may be substantially coplanar with the top surface of the second semiconductor chip 120 and the top surfaces of the pads 122.

The first insulation layer 230 may be disposed on the core layer 210, the first semiconductor chip 110 and the second semiconductor chip 120. In some embodiments, the first insulation layer 230 is a molding layer. In another embodiment, the first insulation layer 230 is a thermoset insulation film. As described in FIG. 1, the first insulation layer 230 may have the first openings 231 that expose the top surfaces of the bumps 112 disposed on the first semiconductor chip 110 and the second openings 232 that expose the top surfaces of the pads 122 disposed on the second semiconductor chip 120. Because the top surfaces of the bumps 112 are substantially coplanar with the top surfaces of the pads 122, a depth d1 of the first openings 231 may be similar or substantially equal to a depth d2 of the second openings 232.

Although not shown in the drawings, in some embodiments, connection members, such as solder balls, may be disposed on the top surfaces of the bumps 112 and/or the top surfaces of the pads 122 that are exposed by the first openings 231 and the second openings 232. The connection members may be electrically coupled to the bumps 112 and/or the pads 122 via interconnection patterns, such as redistributed interconnection lines.

In some embodiments, bottom surfaces of the first semiconductor chip 110 and the core layer 210 are covered with a second insulation layer 240. In some embodiments, the second insulation layer 240 is a molding layer. In another embodiment, the second insulation layer 240 is a thermoset insulation film. In some embodiments, the first insulation layer 230 and the second insulation layer 240 may be the same material. In another embodiment, the material of the first insulation layer 230 may be different from the material of the second insulation layer 240.

Figure 4:
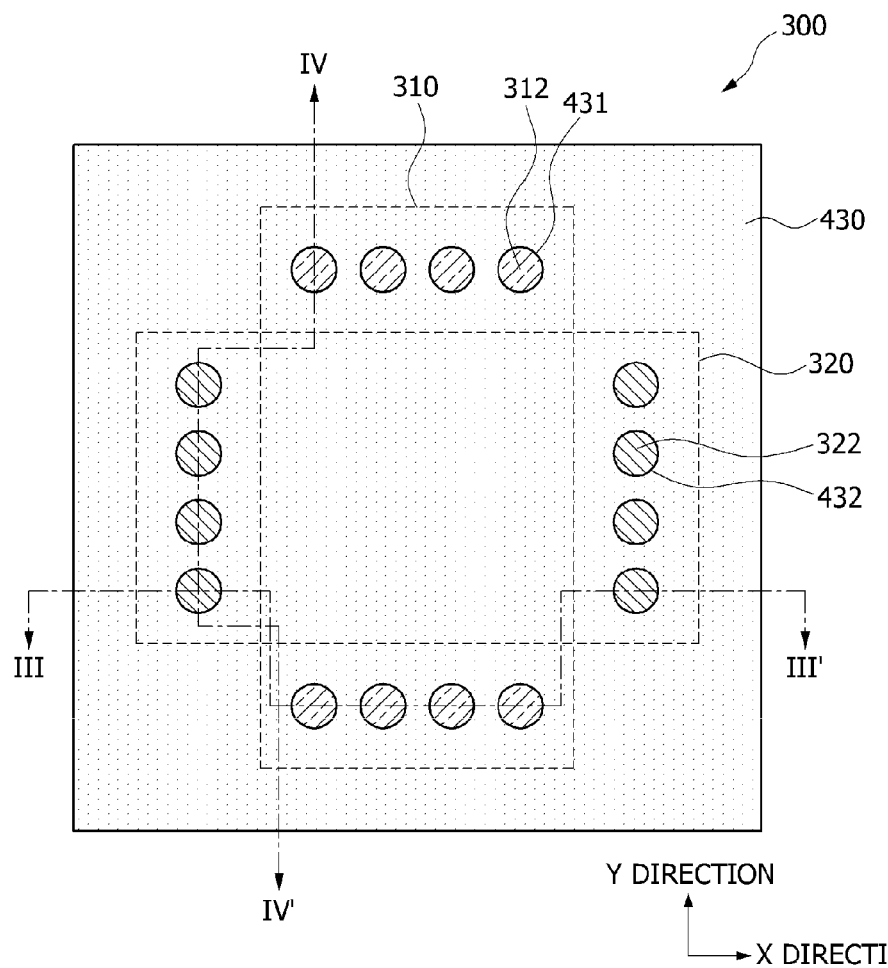
FIG. 4 is a plan view illustrating an embedded package according to some embodiments of the present invention.

FIG. 4 illustrates an embedded package 300 according to some embodiments, which includes a first semiconductor chip 310 and a second semiconductor chip 320 that are stacked above one another. For example, the first semiconductor chip 310 is placed in an orientation that is rotated 90 degrees relative to a placed orientation of the second semiconductor chip 320. In some embodiments, the first semiconductor chips 310 and the second semiconductor chip 320 each have a width and a length that is greater than the width. The first semiconductor chip 310 may have a length in a Y direction and a width in an X direction and the second semiconductor chip 320 may have a length in the X direction and a width in the Y direction, as illustrated in FIG. 4. One or more bumps 312 may be disposed on a top surface of the first semiconductor chip 310. In some embodiments, the bumps 312 may be disposed on two opposite ends of the first semiconductor chip 310, such as ends that are not covered by (e.g., are not directly below) the second semiconductor chip 320. The bumps 312 may be spaced apart from each other. An arrangement, configuration, and/or number of the bumps 312 may vary or be selected based on a function of the first semiconductor chip 310. The two opposite ends of the top surface of the first semiconductor chip 310, on which the bumps 312 are disposed, may not overlap with (e.g., be directly below) the second semiconductor chip 320.

One or more pads 322 may be disposed on a top surface of the second semiconductor chip 320. In some embodiments, the pads 322 may be disposed on two opposite ends of the second semiconductor chip 320 and spaced apart from each other. An arrangement, configuration, and/or number of the pads 322 may vary or be selected based on a function of the second semiconductor chip 320.

As shown in FIG. 4, the bumps 312 of the first semiconductor chip 310 and the pads 322 of the second semiconductor chip 320 have a substantially similar configuration.

For example, the bumps 312 are disposed on the two opposite ends of the first semiconductor chip 310, which are located along the Y direction, and the pads 322 are disposed on the two opposite ends of the second semiconductor chip 320, which are located along the X direction, where the first semiconductor chip 310 and the second semiconductor chip 320 are disposed at different planar orientations with respect to one another. Thus, the two opposite ends of the first semiconductor chip 310, where the bumps 312 are disposed, do not vertically overlap with the two opposite ends of the second semiconductor chip 320, where the pads 322 are disposed.

In some embodiments, the arrangement or configuration of the bumps 312 of the first semiconductor chip 310 is different than the arrangement or configuration of the pads 322 of the second semiconductor chip 320. For example, the bumps 312 may be disposed on the two opposite ends of the first semiconductor chip 310, and the pads 322 may be disposed on a central portion of the second semiconductor chip 320. Following the example, while the two opposite ends of the first semiconductor chip 310, where the bumps 312 are disposed, do not vertically overlap with the second semiconductor chip 320, the central portion of the second semiconductor chip 320, where the pads 322 are disposed, does vertically overlap with the first semiconductor chip 310. Of course, other arrangements or configurations are possible. For example, in some embodiments, the first semiconductor chip 310 may be disposed below the second semiconductor chip 320 such that the orientation of the first semiconductor chip 310 is rotated by an angle that is between 0 and 90 degrees relative to the orientation of the second semiconductor chop 320. In even such embodiments, portions of the first semiconductor chip 310 where the bumps 312 are disposed do not vertically overlap with the second semiconductor chip 320.

In some embodiments, the first semiconductor chip 310 and the second semiconductor chip 320 are covered with a first insulation layer 430. The first insulation layer 430 may have one or more first openings 431 and one or more second openings 432. The first openings 431 may be formed to expose the bumps 312 of the first semiconductor chip 310, and the second openings 432 may be formed to expose the pads 322 of the second semiconductor chip 320. Thus, the number of the first openings 431 may be equal to the number of the bumps 312, and the number of the second openings 432 may be equal to the number of the pads 322. As illustrated in FIG. 4, each of the first and second openings 431 and 432 may have a circular cross-sectional shape. In some embodiments, each of the first and second openings 431 and 432 may have a diagonal or other non-circular, cross-sectional shape.

Figure 5:
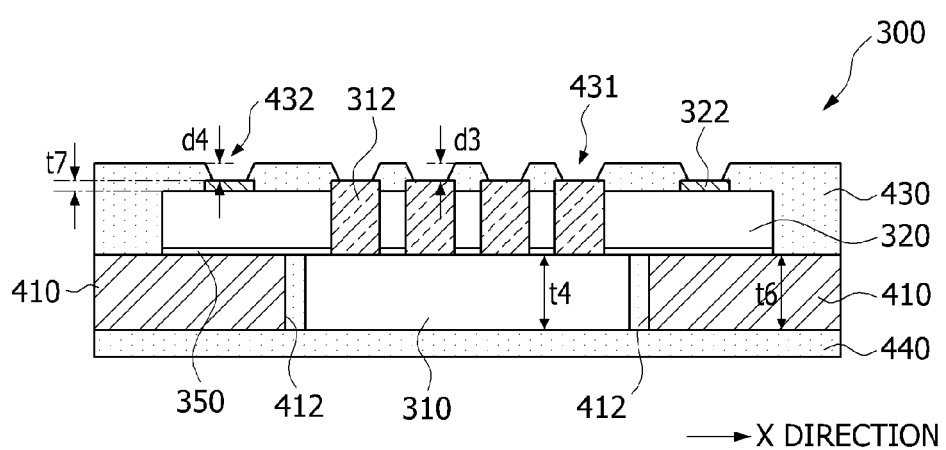
FIG. 5 is a cross-sectional view taken along line III-III' of FIG. 4.
Figure 6:
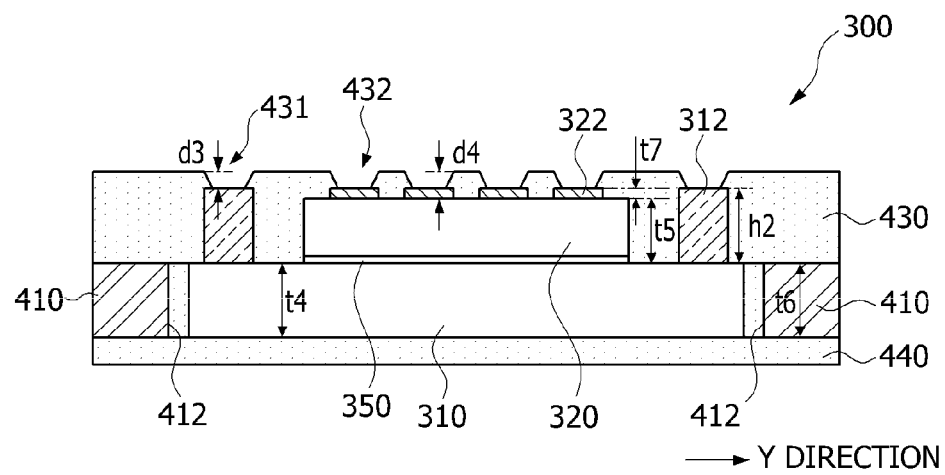
FIG. 6 is a cross-sectional view taken along line IV-IV' of FIG. 4.

Referring to FIGS. 5 and 6, the embedded package 300 includes a core layer 410 that has or contains a cavity 412. The cavity 412 may be disposed or formed in a central region of the core layer 410. The cavity 412 may have a planar area that is configured or shaped to receive the first semiconductor chip 310. In some embodiments, the planar area of the cavity 412 may be equal to or greater than a planar area of the first semiconductor chip 310. For example, a width of the cavity 412 in the X direction may be less than a width of the cavity 412 in the Y direction. The first semiconductor chip 310 may be disposed or placed in the cavity 412. In some embodiments, a thickness t6 of the core layer 410 may be substantially equal to a thickness t4 of the first semiconductor chip 310. Thus, a bottom surface and a top surface of the first semiconductor chip 310 may be coplanar with a bottom surface and a top surface of the core layer 410, respectively. In some embodiments, the thickness t6 of the core layer 410 may be different from the thickness t4 of the first semiconductor chip 310. For example, the thickness t6 of the core layer 410 may be greater than or less than the thickness t4 of the first semiconductor chip 310. In even such embodiments, the top surface of the first semiconductor chip 310 is coplanar with the top surface of the core layer 410. The bumps 312 may be disposed on the two opposite ends of the first semiconductor chip 310, as described herein.

The second semiconductor chip 320 may be attached to or placed on the top surface of the first semiconductor chip 310 using an adhesive agent 350. As shown in FIG. 4, the second semiconductor chip 320 is disposed above the first semiconductor chip 310 such that portions of the second semiconductor chip 320 cross portions of the first semiconductor chip 310 at various angles (e.g., at angles between 0 and 90 degrees). Thus, a portion of the second semiconductor chip 320 may be disposed on or above the first semiconductor chip 310 and other portions of the second semiconductor chip 320 may be disposed on or above the core layer 410. Thus, the core layer 410 may support some portions of the second semiconductor chip 320.

In some embodiments, the pads 322 are disposed on the portions of the second semiconductor chip 320 that are on or above the core layer 410. For example, the pads 322 may be disposed to protrude from a top surface of the second semiconductor chip 320 by a predetermined thickness t7. A height h2 of the bumps 312 disposed on the top surface of the first semiconductor chip 310 may be substantially equal to a sum of (1) a total thickness t5 of the adhesive agent 350 and the second semiconductor chip 320, and (2) the thickness t7 of the pads 322. Thus, the top surfaces of the bumps 312 may be substantially coplanar with the top surfaces of the pads 322. The bumps 312 disposed on the top surface of the first semiconductor chip 310 may be located proximate to sidewalls of the second semiconductor chip 320.

In some embodiments, the first insulation layer 430 is disposed on the core layer 410, the first semiconductor chip 310 and the second semiconductor chip 320. In some embodiments, the first insulation layer 430 is a molding layer. In another embodiment, the first insulation layer 430 is a thermoset insulation film. As shown in FIG. 4, the first insulation layer 430 includes or contains the first openings 431 and the second openings 432. The first openings 431 may expose the top surfaces of the bumps 312 that are disposed on the first semiconductor chip 310. The second openings 432 may expose the top surfaces of the pads 322 that are disposed on the second semiconductor chip 320. Because the top surfaces of the bumps 312 are substantially coplanar with the top surfaces of the pads 322, a depth d3 of the first openings 431 may be substantially equal to a depth d4 of the second openings 432. In some embodiments, connection members, such as solder balls, may be disposed on the top surfaces of one or more of the bumps 312 and/or one or more of the pads 322. In some embodiments, the connection members may be electrically coupled to the bumps 312 and/or the pads 322 through interconnection patterns, such as redistributed interconnection lines.

In some embodiments, bottom surfaces of the first semiconductor chip 310 and the core layer 410 may be covered with a second insulation layer 440. In some embodiments, the second insulation layer 440 is a molding layer. In another embodiment, the second insulation layer 440 is a thermoset insulation film. The first insulation layer 430 and the second insulation layer 440 may be the same material. In another embodiment, a material of the first insulation layer 430 may be different from a material of the second insulation layer 440.

Figure 7:
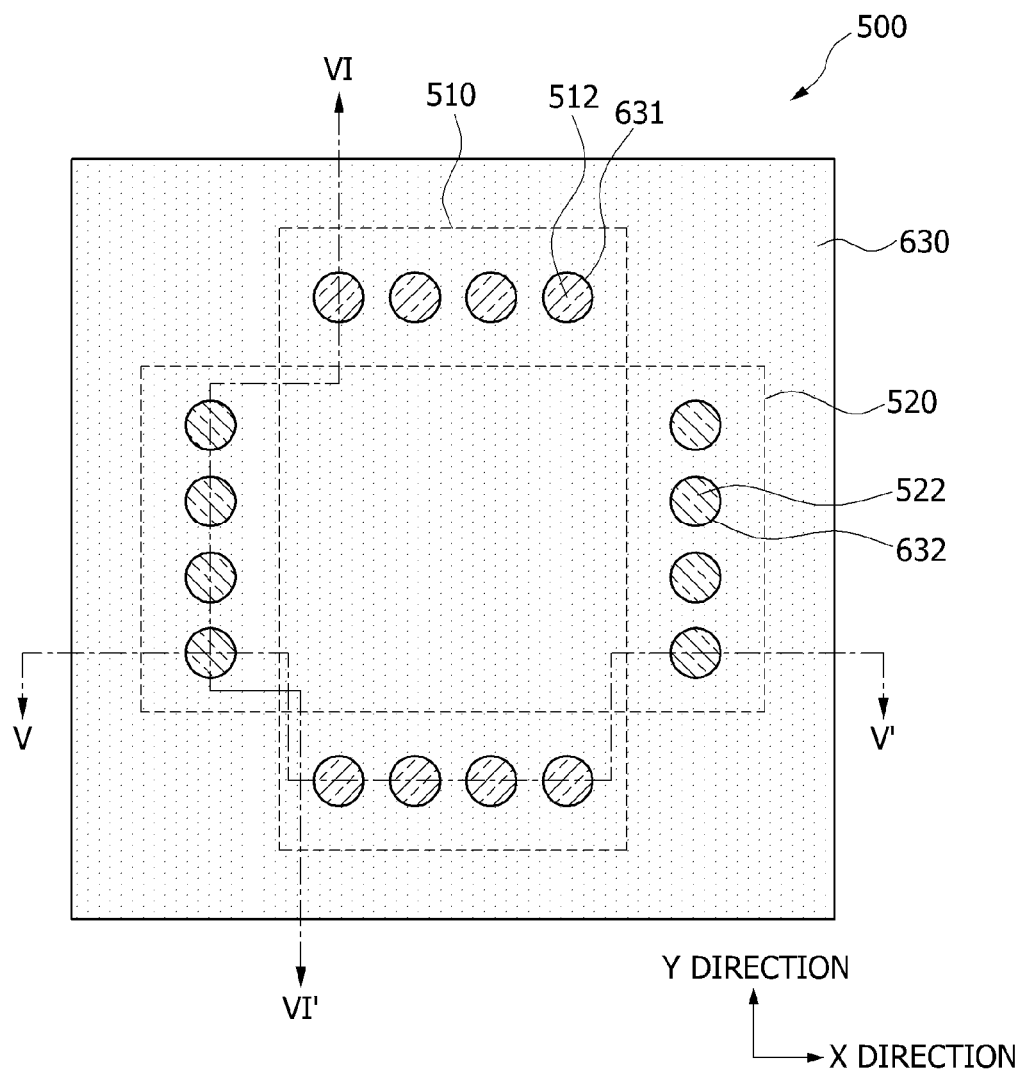
FIG. 7 is a plan view illustrating an embedded package according to some embodiments of the present invention.

FIG. 7 illustrates an embedded package 500 according to some embodiments. The embedded package 500 includes a first semiconductor chip 510 and a second semiconductor chip 520, which are stacked above one another. In some embodiments, the first semiconductor chip 510 and/or the second semiconductor chip 520 may have a width and a length that is greater than the width. For example, the first semiconductor chip 510 may have a length in a Y direction and a width in an X direction and the second semiconductor chip 520 may have a length in the X direction and a width in the Y direction, as illustrated in FIG. 7.

One or more first bumps 512 may be disposed on a top surface of the first semiconductor chip 510. In some embodiments, the first bumps 512 may be disposed or placed on two opposite ends of the first semiconductor chip 510 that are not covered by (e.g., directly below) the second semiconductor chip 520. The first bumps 512 may be spaced apart from each other. An arrangement, configuration, and/or number of the bumps 512 may vary or be selected based on a function of the first semiconductor chip 510. The two opposite ends of the first semiconductor chip 510, on which the first bumps 512 are disposed, may not overlap with (e.g., may not be directly below) the second semiconductor chip 520.

One or more second bumps 522 may be disposed on a top surface of the second semiconductor chip 520. In some embodiments, the second bumps 522 may be disposed on two opposite ends of the second semiconductor chip 520 and spaced apart from each other. An arrangement, configuration, and/or number of the second bumps 522 may vary or be selected based on a function of the second semiconductor chip 520.

In some embodiments, the first bumps 512 on the first semiconductor chip 510 and the second bumps 522 on the second semiconductor chip 520 are disposed in a substantially similar configuration. For example, the first bumps 512 are disposed on the two opposite ends of the first semiconductor chip 510, which are located along the Y direction, and the second bumps 522 are disposed on the two opposite ends of the second semiconductor chip 520, which are located along the X direction. As illustrated in FIG. 7, the first semiconductor chip 510 is disposed or placed below the second semiconductor chip 520 such that the two opposite ends of the first semiconductor chip 510, where the first bumps 512 are disposed, do not vertically overlap the two opposite ends of the second semiconductor chip 520, where the second bumps 522 are disposed.

In some embodiments, the arrangement or configuration of the first bumps 512 of the first semiconductor chip 510 may be different than the arrangement or configuration of the second bumps 522 of the second semiconductor chip 520. For example, the first bumps 512 may be disposed on the two opposite ends of the first semiconductor chip 510, and the second bumps 522 may be disposed on a central portion of the second semiconductor chip 520. In such embodiments, the two opposite ends of the first semiconductor chip 510, where the first bumps 512 are disposed, do not overlap (e.g., are not vertically below) the second semiconductor chip 520, but the central portion of the second semiconductor chip 520, where the second bumps 522 are disposed, does overlap (e.g., is vertically above) the first semiconductor chip 510. In some embodiments, the first semiconductor chip 510 may be disposed or placed below the second semiconductor chip 520 such that the orientation of the first semiconductor chip 510 is rotated by an angle that is between 0 and 90 degrees relative to the orientation of the second semiconductor chip 520. In even such embodiments, portions of the first semiconductor chip 510, where the first bumps 512 are disposed, do not overlap (e.g., are not directly below) the second semiconductor chip 520.

Figure 8:
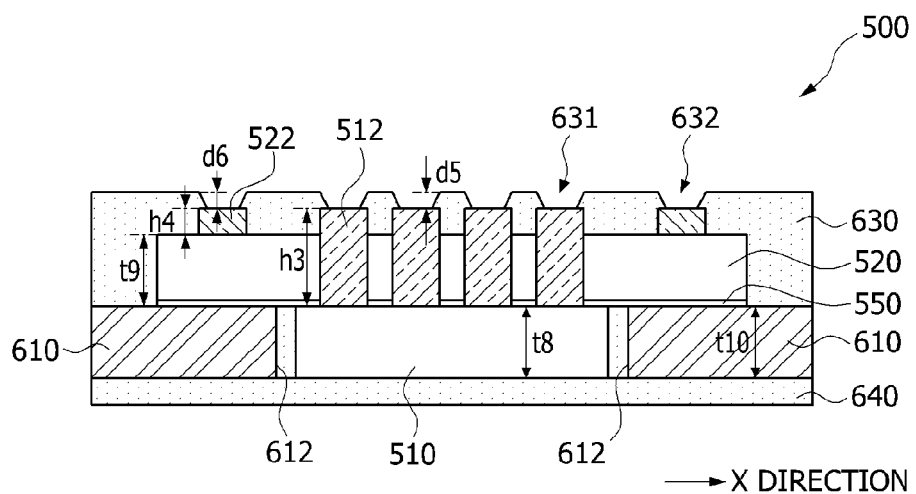
FIG. 8 is a cross-sectional view taken along line V-V' of FIG. 7.
Figure 9:
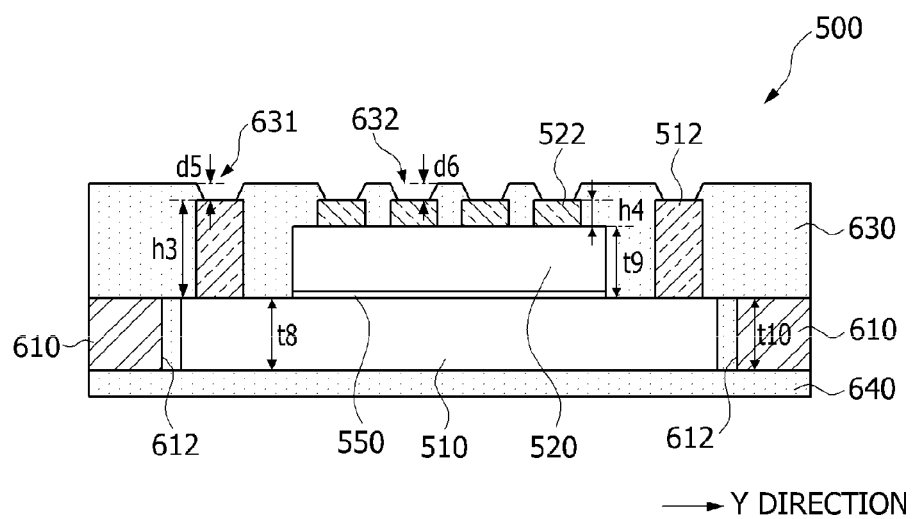
FIG. 9 is a cross-sectional view taken along line VI-VI' of FIG. 7.

In some embodiments, the first semiconductor chip 510 and the second semiconductor chip 520 are covered with a first insulation layer 630. The first insulation layer 630 may have or contain one or more first openings 631 and one or more second openings 632. The first openings 631 may be formed to expose the first bumps 512 on the first semiconductor chip 510, and the second openings 632 may be formed to expose the second bumps 522 on the second semiconductor chip 520. Thus, the number of the first openings 631 may be equal to the number of the first bumps 512, and the number of the second openings 632 may be equal to the number of the second bumps 522. As illustrated in FIG. 7, the first openings 631 and/or the second openings 632 may have a circular cross-sectional shape. In some embodiments, the first openings 631 and the second openings 632 may have a diagonal or other non-circular, cross-sectional shape Referring to FIGS. 8 and 9, the embedded package 500 includes a core layer 610 that has or contains a cavity 612. The cavity 612 may be disposed or formed in a central region of the core layer 610. The cavity 612 may have a planar area that is configured or shaped to receive the first semiconductor chip 510. In some embodiments, the planar area of the cavity 612 may be equal to or greater than a planar area of the first semiconductor chip 510. For example, a width of the cavity 512 in the X direction may be less than a width of the cavity 512 in the Y direction. The first semiconductor chip 510 may be disposed or placed in the cavity 512. In some embodiments, a thickness t10 of the core layer 610 may be substantially equal to a thickness t8 of the first semiconductor chip 510. Thus, a bottom surface and a top surface of the first semiconductor chip 510 may be coplanar with a bottom surface and a top surface of the core layer 610, respectively. In some embodiments, the thickness t10 of the core layer 610 may be different from the thickness t8 of the first semiconductor chip 510. That is, the thickness t10 of the core layer 610 may be greater than or less than the thickness t8 of the first semiconductor chip 510. In even such embodiments, the top surface of the first semiconductor chip 510 is coplanar with the top surface of the core layer 610. The first bumps 512 may be disposed on the two opposite ends of the first semiconductor chip 510, as described herein.

The second semiconductor chip 520 may be fixed or attached to the top surface of the first semiconductor chip 510 using an adhesive agent 550. As shown in FIG. 7, the second semiconductor chip 520 is disposed on or above the first semiconductor chip 510 having various orientations with respect to one another. For example, a portion of the second semiconductor chip 520 may be disposed on the first semiconductor chip 510, and other portions of the second semiconductor chip 520 may be disposed on the core layer 610. That is, the core layer 610 supports the other portions of the second semiconductor chip 520.

In some embodiments, the second bumps 522 are disposed on the portions of the second semiconductor chip 520 that overlap with (e.g., are placed on) the core layer 610. The first bumps 512 disposed on the first semiconductor chip 510 may be located proximate to sidewalls of the second semiconductor chip 520. A height h3 of the first bumps 512 disposed on the top surface of the first semiconductor chip 510 may be substantially equal to a sum of (1) a total thickness t9 of the adhesive agent 550 and the second semiconductor chip 520, and (2) a height h4 of the second bumps 522. Thus, the top surfaces of the first bumps 512 may be substantially coplanar with the top surfaces of the second bumps 522.

The first insulation layer 630 may be disposed on the core layer 610, the first semiconductor chip 510 and the second semiconductor chip 520. In some embodiments, the first insulation layer 630 is a molding layer. In another embodiment, the first insulation layer 630 is a thermoset insulation film. As shown in FIG. 7, the first insulation layer 630 includes the first openings 631 and the second openings 632. The first openings 631 expose the top surfaces of the first bumps 512 disposed on the first semiconductor chip 510. The second openings 632 expose the top surfaces of the second bumps 522 disposed on the second semiconductor chip 520. Because the top surfaces of the first bumps 512 are substantially coplanar with the top surfaces of the second bumps 522, a depth d5 of the first openings 631 may be substantially equal to a depth d6 of the second openings 632.

In some embodiments, connection members, such as solder balls, may be disposed on the top surfaces of one or more of the first and second bumps 512 and 522 exposed by the first and second openings 631 and 632, respectively. In some embodiments, the connection members may be electrically coupled to the first and second bumps 512 and 522 through interconnection patterns, such as redistributed interconnection lines.

In some embodiments, bottom surfaces of the first semiconductor chip 510 and the core layer 610 may be covered with a second insulation layer 640. In some embodiments, the second insulation layer 640 is a molding layer. In another embodiment, the second insulation layer 640 is a thermoset insulation film. In some embodiments, the first insulation layer 630 and the second insulation layer 640 may be the same material. In another embodiment, a material of the first insulation layer 630 may be different from a material of the second insulation layer 640.

Figure 12:
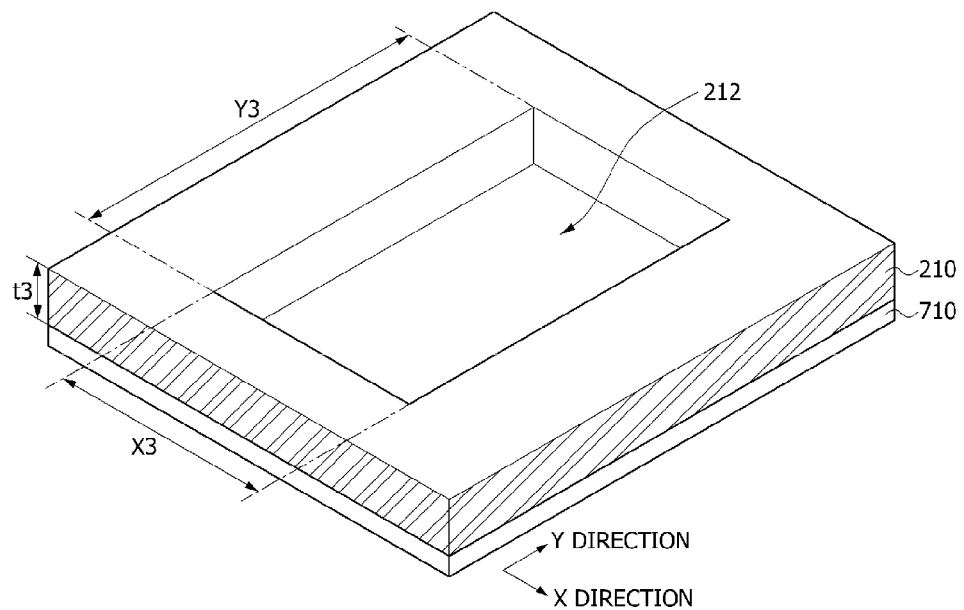
Figure 13:
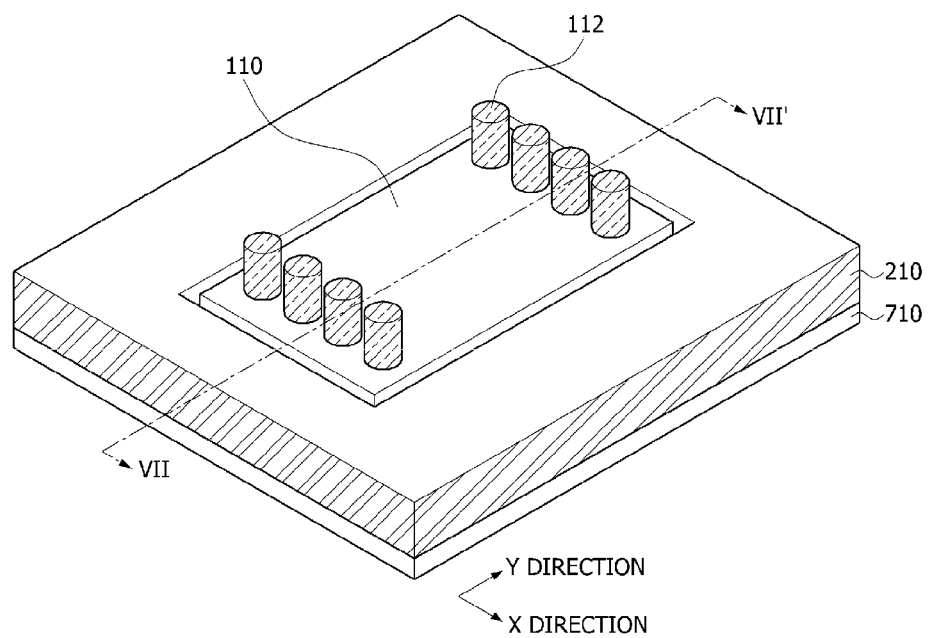
Figure 14:
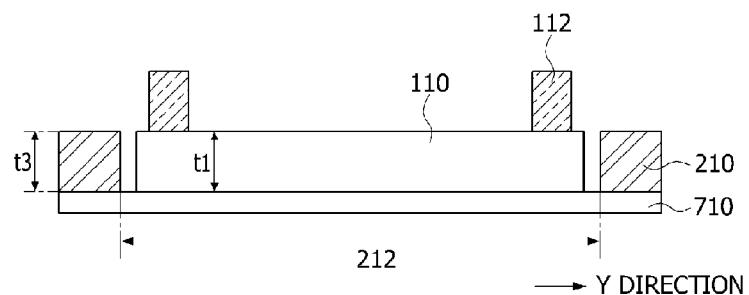
Figure 15:
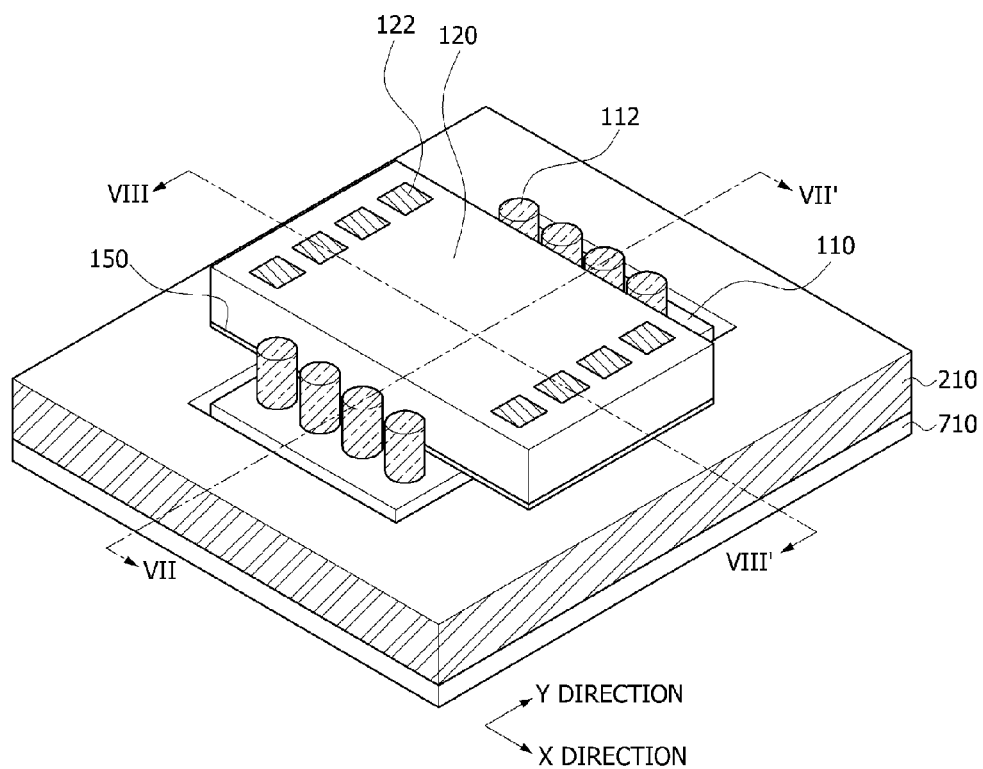
Figure 16:
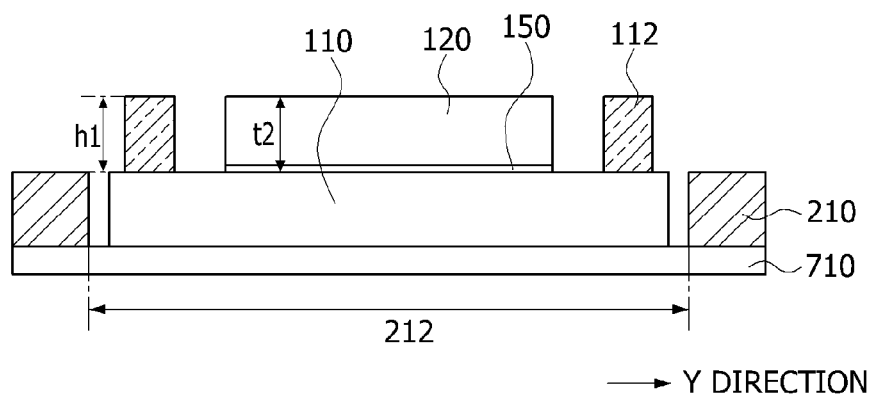
Figure 17:
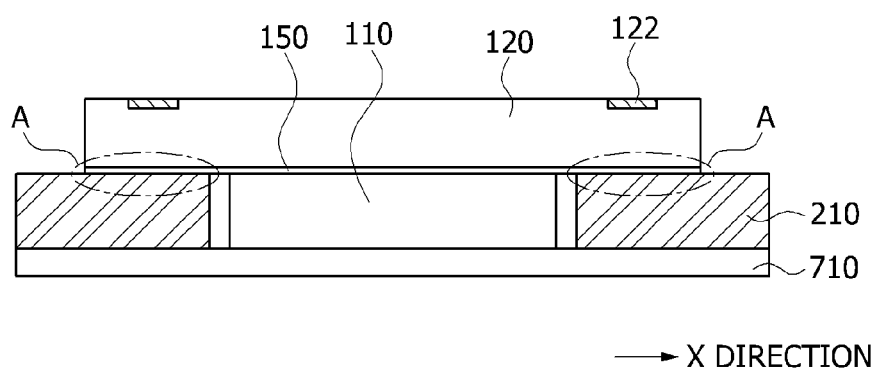
Figure 18:
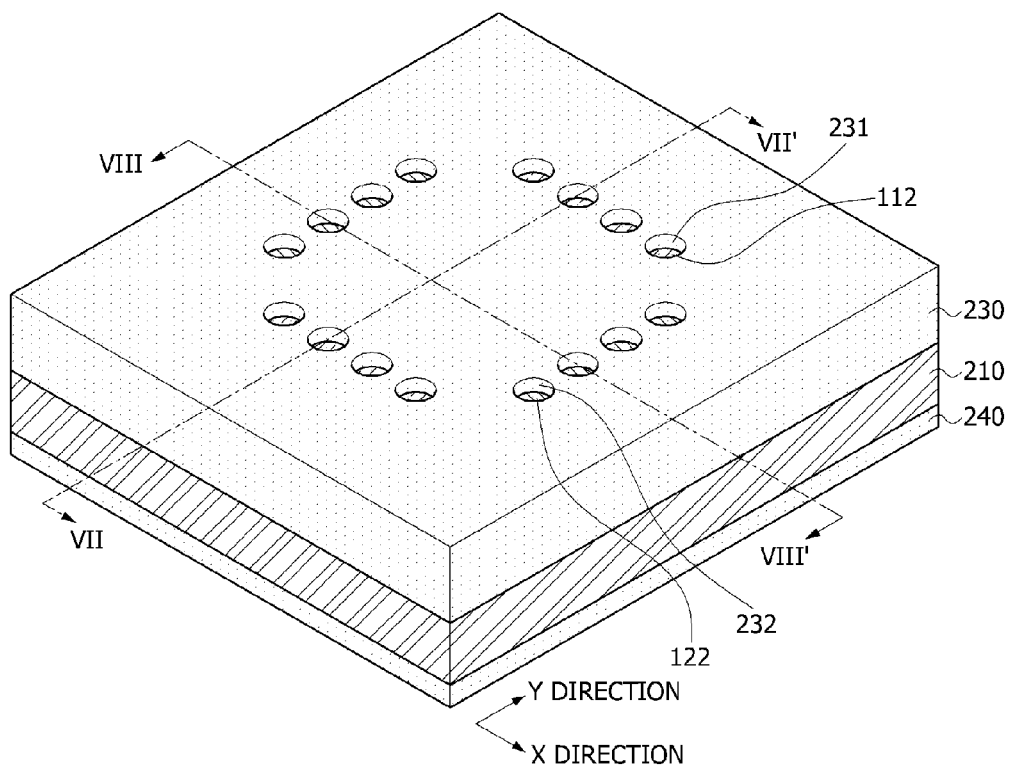
Figure 19:
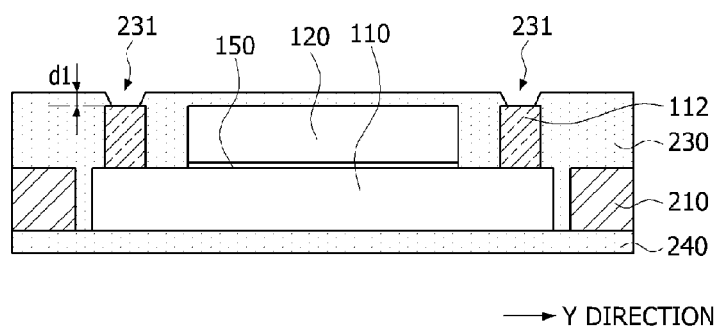
Figure 20:
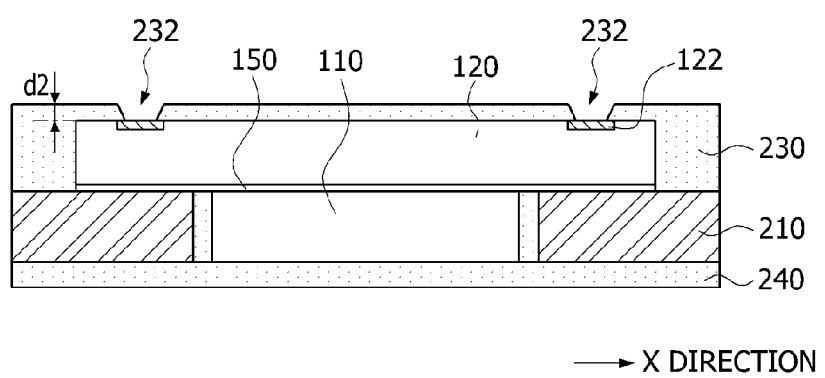

FIGS. 10 to 20 are schematic views illustrating a method of fabricating an embedded package according to some embodiments of the present invention. FIG. 14 is a cross-sectional view taken along a line VII-VII' of FIG. 13. FIGS. 16 and 17 are cross-sectional views taken along lines VII-VII' and VIII-VIII' of FIG. 15, respectively. FIGS. 19 and 20 are cross-sectional views taken along lines VII-VII' and VIII-VIII' of FIG. 18, respectively.

Figure 10:
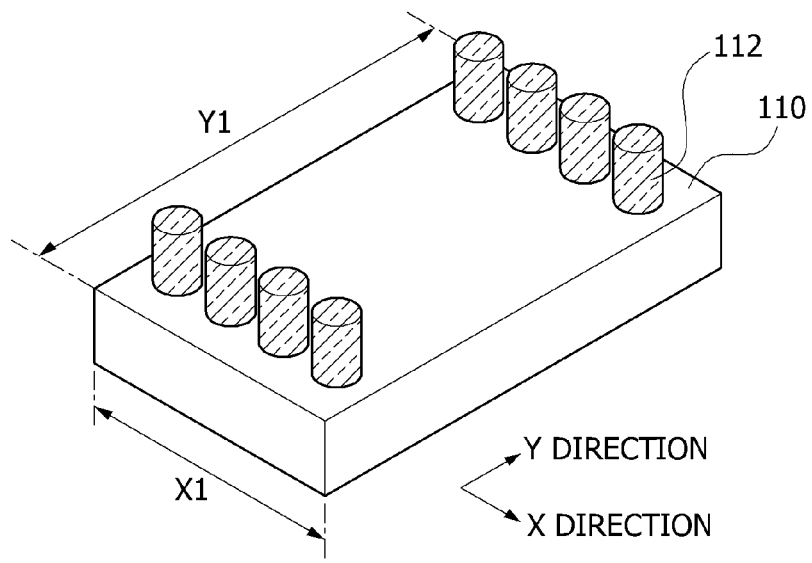
FIGS. 10 to 20 are schematic views illustrating a method of fabricating an embedded package according to some embodiments of the present invention.

Referring to FIG. 10, a first semiconductor chip 110 having a thickness (t1 of FIGS. 1 and 2) is provided. A plurality of bumps 112 are formed on a top surface of the first semiconductor chip 110. The first semiconductor chip 110 may have a rectangular cross-sectional shape. That is, a length Y1 of the first semiconductor chip 110 in a Y direction may be greater than a width X1 of the first semiconductor chip 110 in an X direction. The bumps 112 are formed on two opposite ends of the first semiconductor chip 110, which are located along the Y direction. As shown in FIG. 10, four bumps 112 are formed on each end of the first semiconductor chip 110 and spaced apart from each other. A height of the bumps 112 disposed on the top surface of the first semiconductor chip 110 may be equal to or greater than a thickness of a second semiconductor chip that is stacked on the first semiconductor chip 110 in a subsequent step.

Figure 11:
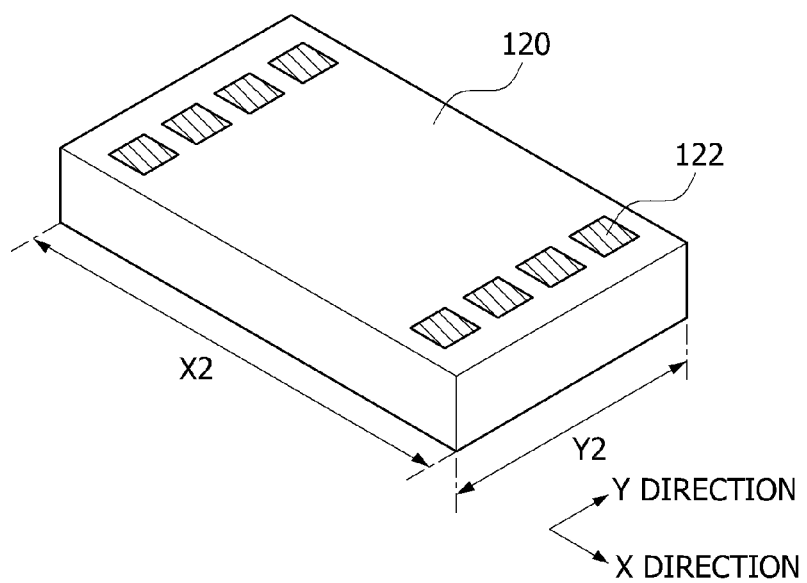

Referring to FIG. 11, a second semiconductor chip 120 is provided. A plurality of pads 122 are formed on a top surface of the second semiconductor chip 120. The second semiconductor chip 120 may have a rectangular cross-sectional shape. That is, a length X2 of the second semiconductor chip 120 in the X direction may be greater than a width Y2 of the second semiconductor chip 120 in the Y direction. The length X2 and the width Y2 of the second semiconductor chip 120 may be equal to the length Y1 and the width X1 of the first semiconductor chip 110, respectively. In addition, the first and second semiconductor chip 110 and 120 may be chips having substantially the same function. However, in some embodiments, the length X2 of the second semiconductor chip 120 may be different from the length Y1 of the first semiconductor chip 110 and/or the width Y2 of the second semiconductor chip 120 may be different from the width X1 of the first semiconductor chip 110. The pads 122 may be formed on two opposite ends of the second semiconductor chip 120. As shown in FIG. 11, four pads 122 are formed on each end of the second semiconductor chip 120 and spaced apart from each other.

Referring to FIG. 12, a core layer 210 having a cavity 212 is provided. A thickness t3 of the core layer 210 may be substantially equal to a thickness of the first semiconductor chip 110, which is placed in the cavity 212 of the core layer 210 in a subsequent step. The cavity 212 of the core layer 210 may have a rectangular or other cross-sectional shape. For example, the cavity 212 may have a length Y3 in the Y direction and a width X3 in the X direction. The length Y3 of the cavity 212 may be equal to or greater than the length Y1 of the first semiconductor chip 110, and the width X3 of the cavity 212 may be equal to or greater than the width X1 of the first semiconductor chip 110. A temporary supporting layer 710 may be attached to a bottom surface of the core layer 210. If the cavity 212 penetrates the core layer 210, the temporary supporting layer 710 may close a bottom opening of the cavity 212. In such embodiments, a portion of a top surface of the temporary supporting layer 710 may be exposed by the cavity 212 of the core layer 210.

Referring to FIGS. 13 and 14, the first semiconductor chip 110 illustrated in FIG. 10 is placed or otherwise disposed in the cavity 212 of the core layer 210. The first semiconductor chip 110 may be placed in the cavity 212 such that a length of the first semiconductor chip 110 is parallel to the Y direction. As shown in FIG. 12, the thickness t3 of the core layer 210 is equal to the thickness t1 of the first semiconductor chip 110. Thus, after the first semiconductor chip 110 is placed in the cavity 212, the top surface of the first semiconductor chip 110 is substantially coplanar with the top surface of the core layer 210. After the first semiconductor chip 110 is placed in the cavity 212, the bumps 112 formed on the first semiconductor chip 110 may protrude upwardly from top surfaces of the two opposite ends of the first semiconductor chip 110.

Referring to FIGS. 15, 16 and 17, the second semiconductor chip 120 illustrated in FIG. 11 is attached to the top surfaces of the first semiconductor chip 110 and the core layer 210 using an adhesive agent 150. The adhesive agent 150 may include an adhesive film. In some embodiments, the second semiconductor chip 120 may be attached to the first semiconductor chip 110 such that the bumps 112 do not overlap (e.g., are not directly below) the second semiconductor chip 120 and the pads 122 do not overlap (e.g., are not directly above) the first semiconductor chip 110. In another embodiment, the pads 122 disposed on the second semiconductor chip 120 may overlap (e.g., be directly above) the first semiconductor chip 110. As shown in FIG. 15, the second semiconductor chip 120 is stacked on the first semiconductor chip 110 such that the second semiconductor chip 120 is rotated 90 degrees with respect to the first semiconductor chip 110. For example, the first semiconductor chip 110 may be disposed to be parallel with the Y direction and the second semiconductor chip 120 may be disposed to be parallel with the X direction. Thus, a central portion of the second semiconductor chip 120 may be attached to the first semiconductor chip 110, and the two opposite ends of the second semiconductor chip 120 may be attached to the core layer 210 as shown in portions "A" of FIG. 17. Therefore, although a thickness of the second semiconductor chip 120 may be reduced, the core layer 210 may prevent the second semiconductor chip 120 from warping when the second semiconductor chip 120 is attached to the first semiconductor chip 110.

A total thickness t2 of the second semiconductor chip 120 and the adhesive agent 150 may be substantially equal to a height h1 of the bumps 112 on the first semiconductor chip 110. Thus, top surfaces of the bumps 112 may be coplanar with a top surface of the second semiconductor chip 120.

In some embodiments, the second semiconductor chip 320, which includes the pads 322, as illustrated in FIGS. 4, 5 and 6, may be attached to the first semiconductor chip 110 using the adhesive agent 150. In such embodiments, the height h1 of the bumps 112 may be substantially equal to a sum of (1) a total thickness of the second semiconductor chip 320 and the adhesive agent 150, and (2) a thickness of the pads 322. Thus, the top surfaces of the pads 322 may be coplanar with the top surfaces of the bumps 112.

Referring to FIGS. 18, 19 and 20, a first insulation layer 230 is formed on the core layer 210, the first semiconductor chip 110 and the second semiconductor chip 120. In some embodiments, the first insulation layer 230 is formed of a polymer layer. In another embodiment, the first insulation layer 230 is formed of a thermoset insulation film. Subsequently, the temporary supporting layer 710 is removed from the first semiconductor chip 110 and the core layer 210, and a second insulation layer 240 is formed on bottom surfaces of the first semiconductor chip 110 and the core layer 210. The second insulation layer 240 may be formed of the same material as the first insulation layer 230. However, in some embodiments, the second insulation layer 240 may be formed of a material that is different from a material of the first insulation layer 230. The second insulation layer 240 may be formed of a polymer layer or a thermoset insulation film. Portions of the first insulation layer 230 are then removed to form first openings 231 and second openings 232. The first openings 231 may be formed to expose the bumps 112, and the second openings 232 may be formed to expose the pads 122. In some embodiments, the first openings 231 and the second openings 232 may be formed using a laser process. The laser process may be performed using a carbon dioxide ($CO_2$) laser, a UV-YAG laser, and so on. After the laser process, a de-smear treatment process may be additionally performed to remove resin residues that remain on the exposed bumps 112 and/or the exposed pads 122.

As described herein, the top surfaces of the bumps 112 may be coplanar with the top surfaces of the pads 122. Thus, a thickness d1 of the first insulation layer 230 on the bumps 112 may also be equal to a thickness d2 of the first insulation layer 230 on the pads 122. Accordingly, the bumps 112 and the pads 122 may be simultaneously exposed during the laser process for forming the first openings 231 and the second openings 232. For example, when a laser process is used to create contact holes, such as the openings 231 and 232, the contact holes may be formed having an aspect ratio of about "1". Thus, if the thickness of the first insulation layer 230 on the bumps 112 and the pads 122 increases, a diameter of the first and second openings 231 and 232 may also increase when the laser process is used to form the openings 231 and 232. In such embodiments, reducing a pitch of the openings 231 and 232 may be difficult. However, the first insulation layer 230 may be formed such that the thickness d1 and the thickness d2 are equal to each other, and the first and second openings 231 and 232 may be formed having a fine pitch.

In some embodiments, interconnection patterns that are electrically coupled to the bumps 112 and/or the pads 122 may be formed on the first insulation layer 230. In some embodiments, the interconnection patterns may be formed of redistributed interconnection lines. A solder resist layer may then be formed on the first insulation layer 230 and the interconnection patterns to expose portions of the interconnection patterns. Connection members, such as solder balls, may be formed on the exposed portions of the interconnection patterns.

Figure 23:
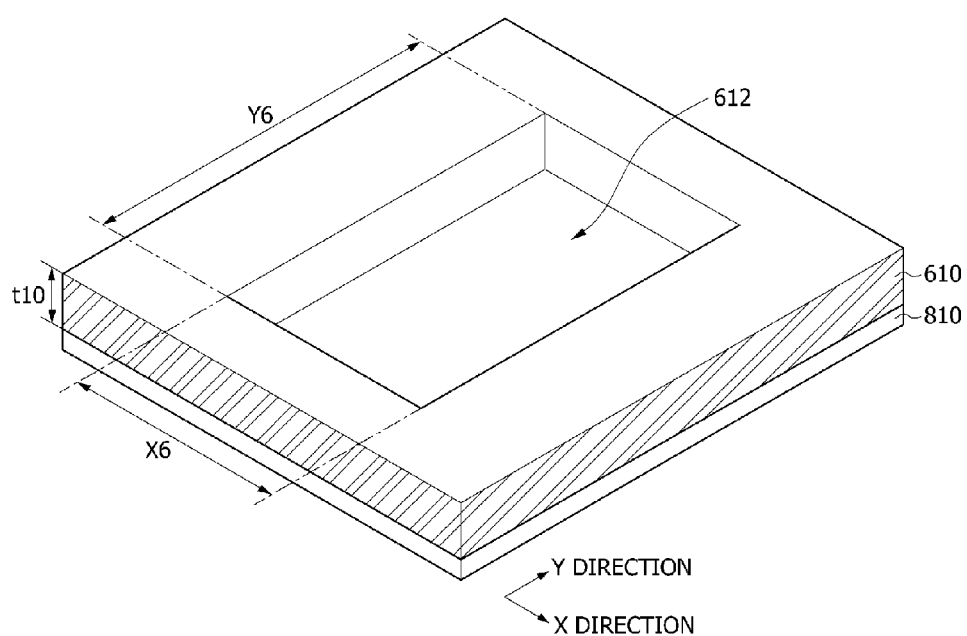
Figure 24:
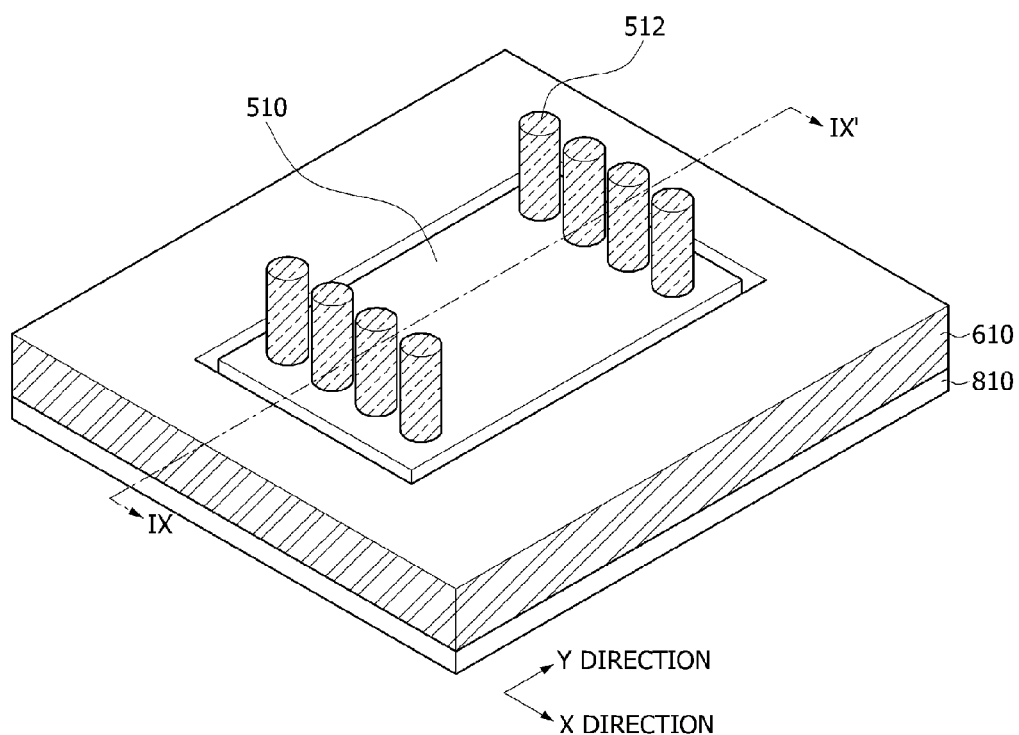
Figure 25:
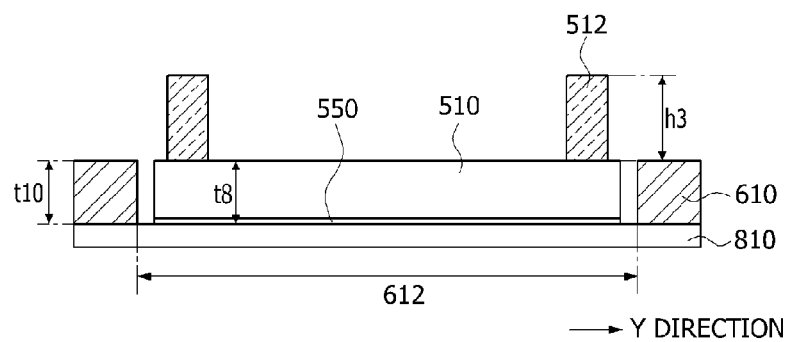
Figure 26:
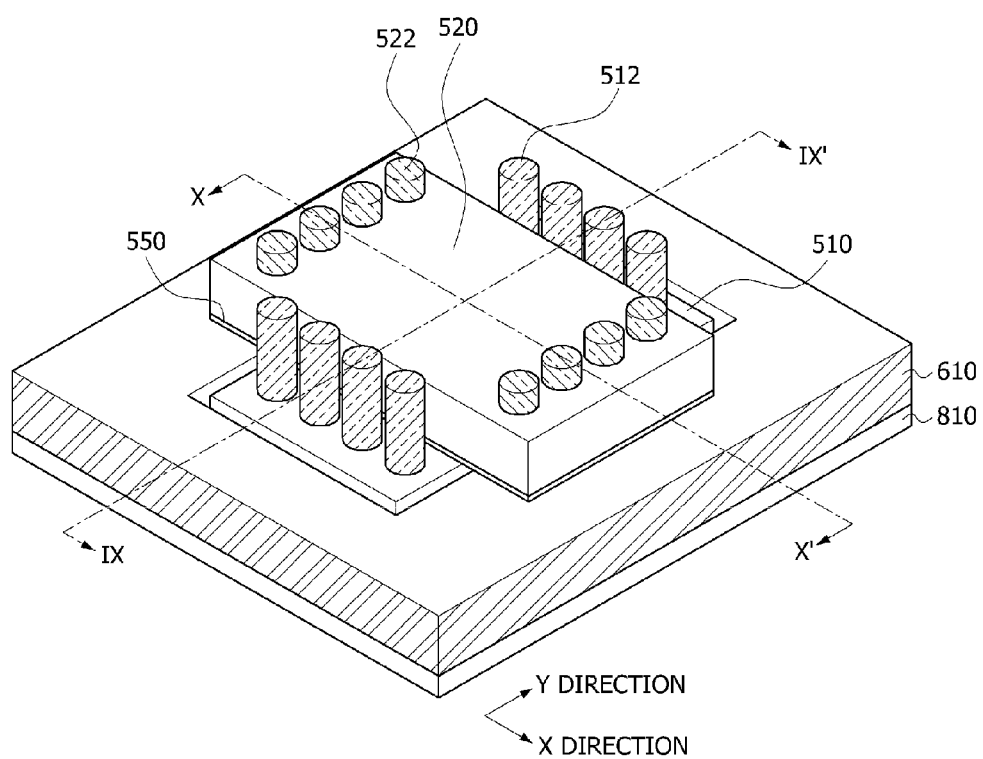
Figure 27:
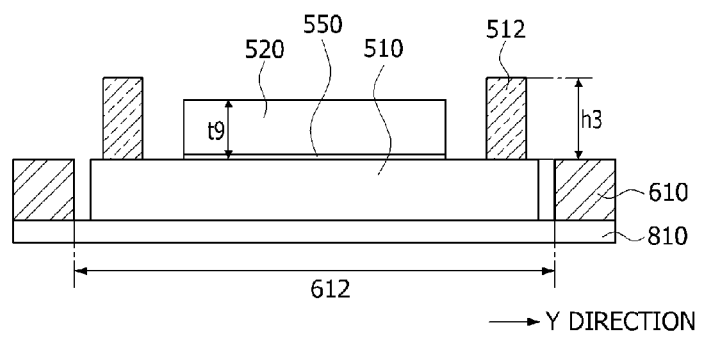
Figure 28:
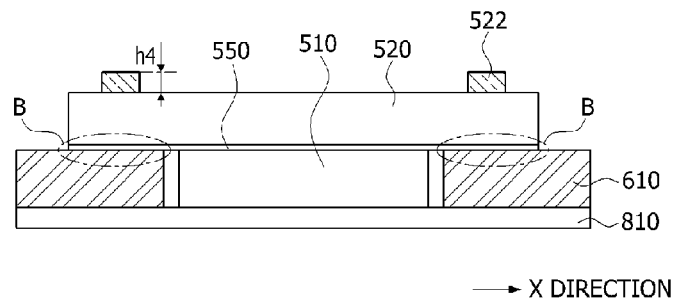
Figure 29:
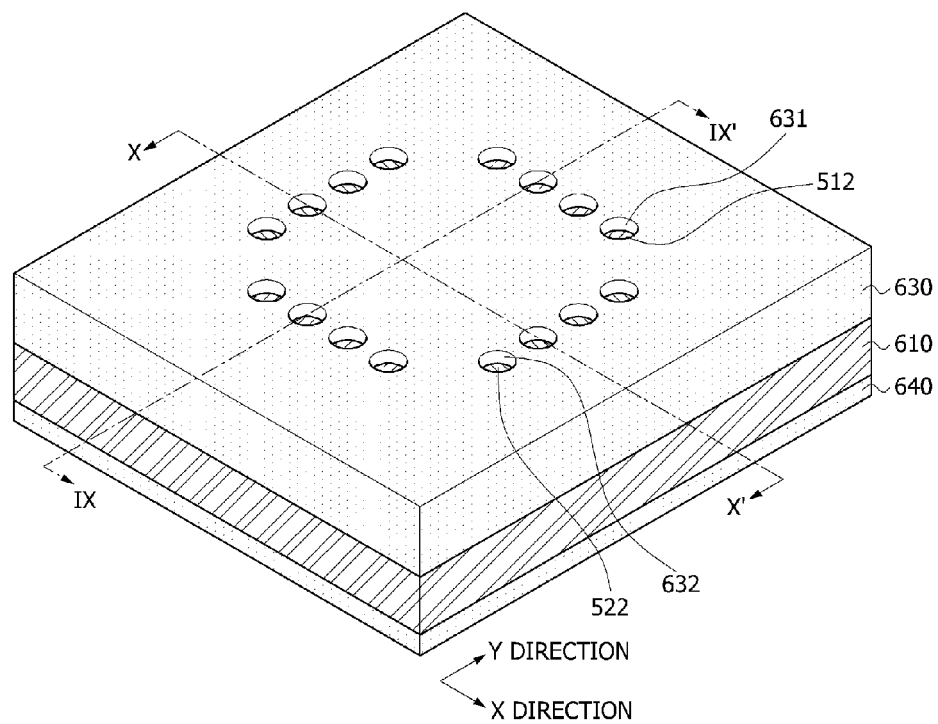
Figure 30:
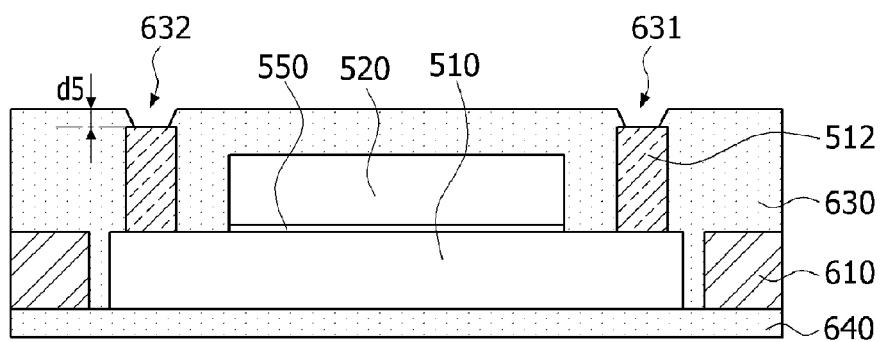
Figure 31:
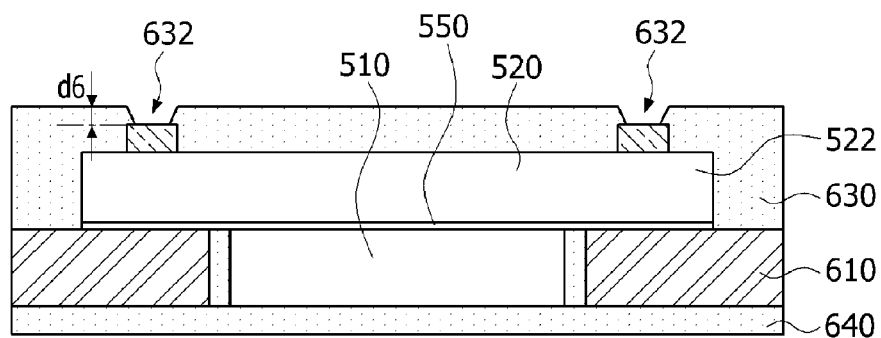

FIGS. 21 to 31 are schematic views illustrating a method of fabricating an embedded package according to some embodiments of the present invention. FIG. 25 is a cross-sectional view taken along a line IX-IX' of FIG. 24. FIGS. 27 and 28 are cross-sectional views taken along lines IX-IX' and X-X' of FIG. 26, respectively. FIGS. 30 and 31 are cross-sectional views taken along lines IX-IX' and X-X' of FIG. 29, respectively.

Figure 21:
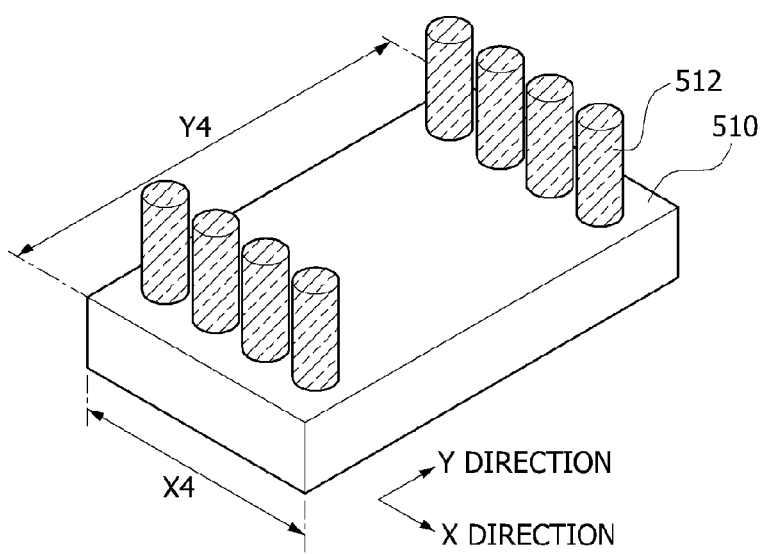
FIGS. 21 to 31 are schematic views illustrating a method of fabricating an embedded package according to some embodiments of the present invention.

Referring to FIG. 21, a first semiconductor chip 510 is provided. A plurality of first bumps 512 are formed on a top surface of the first semiconductor chip 510. The first semiconductor chip 510 may have a cross-sectional rectangular or other geometrical shape. That is, a length Y4 of the first semiconductor chip 510 in a Y direction may be greater than a width X4 of the first semiconductor chip 510 in an X direction. The first bumps 512 may be formed on two opposite ends of the first semiconductor chip 510. As shown in FIG. 21, four first bumps 512 may be formed on each end of the first semiconductor chip 510 and spaced apart from each other.

Figure 22:
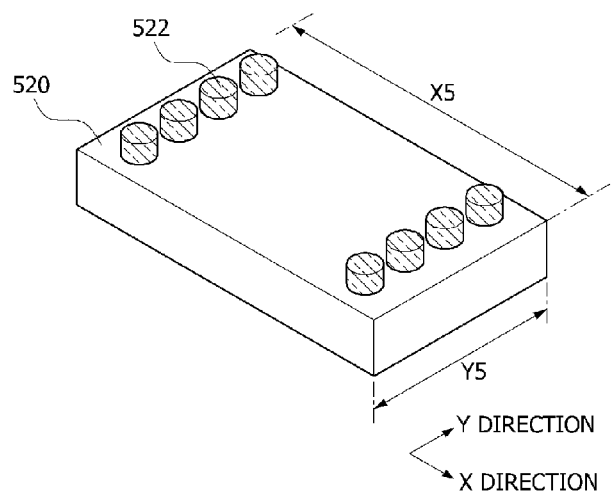

Referring to FIG. 22, a second semiconductor chip 520 is provided. A plurality of second bumps 522 are formed on a top surface of the second semiconductor chip 520. The second semiconductor chip 520 may have a cross-sectional rectangular or other geometrical shape. For example, a length X5 of the second semiconductor chip 520 in the X direction may be greater than a width Y5 of the second semiconductor chip 520 in the Y direction. The length X5 and the width Y5 of the second semiconductor chip 520 may be equal to the length Y4 and the width X4of the first semiconductor chip 510, respectively. In addition, the first and second semiconductor chip 510 and 520 may be chips having substantially the same function. However, in some embodiments, the length X5 of the second semiconductor chip 520 may be different from the length Y4 of the first semiconductor chip 510 and/or the width Y5 of the second semiconductor chip 520 may be different from the width X4 of the first semiconductor chip 510. The second bumps 522 may be formed on two opposite ends of the second semiconductor chip 520. As shown in FIG. 22, four second bumps 522 may be formed on each end of the second semiconductor chip 520 and spaced apart from each other.

Referring to FIG. 23, a core layer 610 having a cavity 612 is provided. A thickness t10 of the core layer 610 may be substantially equal to a thickness of the first semiconductor chip 510, which is placed in the cavity 612 of the core layer 610 in a subsequent step. The cavity 612 of the core layer 610 may have a cross-sectional rectangular or other geometrical shape. For example, the cavity 612 may have a length Y6 in the Y direction and a width X6 in the X direction. The length Y6 of the cavity 612 may be equal to or greater than the length Y4 of the first semiconductor chip 510, and the width X6 of the cavity 612 may be equal to or greater than the width X4 of the first semiconductor chip 510. Subsequently, a temporary supporting layer 810 may be attached to a bottom surface of the core layer 610. If the cavity 612 penetrates the core layer 610, the temporary supporting layer 810 may close a bottom opening of the cavity 612. In such embodiments, a portion of a top surface of the temporary supporting layer 810 may be exposed by the cavity 612 of the core layer 610.

Referring to FIGS. 24 and 25, the first semiconductor chip 510 illustrated in FIG. 21 is placed or otherwise disposed in the cavity 612 of the core layer 610. The first semiconductor chip 510 is placed in the cavity 612 such that a length of the first semiconductor chip 510 is parallel with the Y direction. As shown in FIG. 23, the thickness t10 of the core layer 610 may be equal to the thickness of the first semiconductor chip 510. Thus, after the first semiconductor chip 510 is placed in the cavity 612, the top surface of the first semiconductor chip 510 is substantially coplanar with the top surface of the core layer 610. After the first semiconductor chip 510 is placed in the cavity 612, the first bumps 512 formed on the first semiconductor chip 510 may protrude upwardly from top surfaces of the two opposite ends of the first semiconductor chip 510.

Referring to FIGS. 26, 27 and 28, the second semiconductor chip 520 illustrated in FIG. 22 is attached to the top surfaces of the first semiconductor chip 510 and the core layer 610 using an adhesive agent 550. The adhesive agent 550 may include an adhesive film. In some embodiments, the second semiconductor chip 520 may be attached to the first semiconductor chip 510 such that the first bumps 512 do not overlap (e.g., are not directly below) the second semiconductor chip 520 and the second bumps 522 do not overlap (e.g., are not directly above) the first semiconductor chip 510. In another embodiment, the second bumps 522 disposed on the second semiconductor chip 520 may overlap (e.g., may be directly above) the first semiconductor chip 510. As shown in FIG. 26, the second semiconductor chip 520 is stacked on or above the first semiconductor chip 510 in an orientation that is at a right angle to the orientation of the first semiconductor chip 510. That is, as illustrated in FIG. 26, the first semiconductor chip 510 is disposed to be parallel with the Y direction and the second semiconductor chip 520 is disposed to be parallel with the X direction. Thus, a central portion of the second semiconductor chip 520 may be attached to the first semiconductor chip 510, and the two opposite ends of the second semiconductor chip 520 may be attached to the core layer 610 as shown in portions "B" of FIG. 28. Therefore, although a thickness of the second semiconductor chip 520 is reduced, the core layer 610 may prevent the second semiconductor chip 520 from warping after the second semiconductor chip 520 is attached to the first semiconductor chip 510.

A height h3 of the first bumps 512 on the first semiconductor chip 510 may be substantially equal to a sum of (1) a total thickness t9 of the second semiconductor chip 520 and the adhesive agent 550, and (2) a height h4 of the second bumps 522. Thus, the top surfaces of the first bumps 512 may be coplanar with the top surfaces of the second bumps 522.

Referring to FIGS. 29, 30 and 31, a first insulation layer 630 is formed on the core layer 610, the first semiconductor chip 510 and the second semiconductor chip 520. In some embodiments, the first insulation layer 630 may be formed of a polymer layer. In another embodiment, the first insulation layer 630 is formed of a thermoset insulation film. Subsequently, the temporary supporting layer 810 is removed from the first semiconductor chip 510 and the core layer 610, and a second insulation layer 640 is formed on bottom surfaces of the first semiconductor chip 510 and the core layer 610. The second insulation layer 640 may be formed of the same material as the first insulation layer 630. However, in some embodiments, the second insulation layer 640 may be formed of a material that is different from a material of the first insulation layer 630. The second insulation layer 640 may be formed of a polymer layer or a thermoset insulation film. Portions of the first insulation layer 630 are then removed to form the first openings 631 and the second openings 632. The first openings 631 may be formed to expose the first bumps 512, and the second openings 632 may be formed to expose the second bumps 522. In some embodiments, the first openings 631 and the second openings 632 may be formed using a laser process. The laser process may be performed using a carbon dioxide ($CO_2$) laser, a UV-YAG laser, and so on. After the laser process, a de-smear treatment process may be additionally performed to remove resin residues that remain on the exposed first bumps 512 and/or the exposed second bumps 522.

As described herein, the top surfaces of the first bumps 512 may be coplanar with the top surfaces of the second bumps 522. Thus, a thickness d5 of the first insulation layer 630 on the first bumps 512 may also be equal to a thickness d6 of the first insulation layer 630 on the second bumps 522. Accordingly, the first bumps 512 and the second bumps 522 may be simultaneously exposed during the laser process for forming the first and second openings 631 and 632. For example, when a laser process is used in forming contact holes, such as the openings 631 and 632, the contact holes may be formed to have an aspect ratio of about "1". Thus, if the thickness of the first insulation layer 630 on the first bumps 512 and the second bumps 522 increases, a diameter of the first and second openings 631 and 632 may also increase when the laser process is used to form the openings 631 and 632. In such embodiments, reducing a pitch of the openings 631 and 632 may be difficult. However, the first insulation layer 630 may be formed such that the thickness d5 and the thickness d6 may be equal to each other and the first and second openings 631 and 632 may be formed having a fine pitch.

In some embodiments, interconnection patterns electrically coupled to the first bumps 512 and the second bumps 522 may be formed on the first insulation layer 630. In some embodiments, the interconnection patterns may be formed of redistributed interconnection lines. A solder resist layer may then be formed on the first insulation layer 630 and the interconnection patterns to expose portions of the interconnection patterns. Connection members, such as solder balls, may be formed on the exposed portions of the interconnection patterns.

In some embodiments, the thin embedded packages described herein may be applied to various electronic systems.

Figure 32:
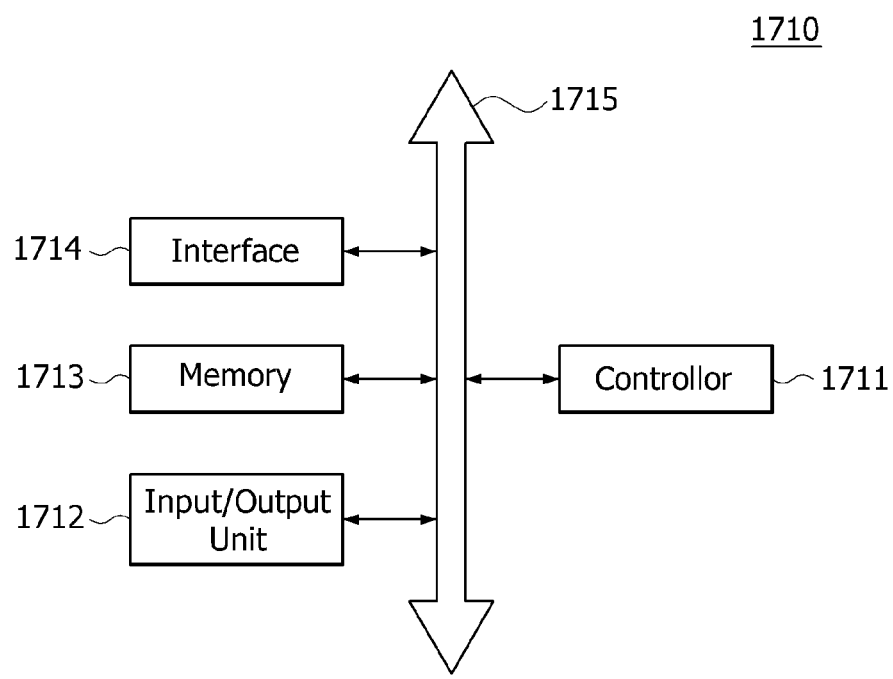
FIG. 32 is a block diagram illustrating an electronic system that includes an embedded package according to some embodiments of the present invention.

Referring to FIG. 32, the embedded packages described herein may be incorporated by an electronic system 1710. The electronic system 1710 includes a controller 1711, an input/output unit 1712, and a memory component 1713. The controller 1711, the input/output unit 1712 and the memory component 1713 may be coupled with one another through a bus 1715 that provides a data transmission path.

In some embodiments, the controller 1711 may include at least one microprocessor, at least one digital signal processor, at least one microcontroller, and/or logic devices capable of performing the same functions as these components. The controller 1711 and/or the memory component 1713 may include any one of the embedded packages described herein. The input/output unit 1712 may include or be a keypad, a keyboard, a display device, a touch screen, and so on. The memory component 1713 is a device for storing data. The memory component 1713 may store data and/or commands to be executed by the controller 1711, among other functions.

The memory component 1713 may include a volatile memory device, such as a DRAM device, and/or a nonvolatile memory device, such as a flash memory device. For example, a flash memory device may be mounted to an information processing system, such as a mobile terminal or a desktop computer. The flash memory device may constitute a solid state disk (SSD). In such cases, the electronic system 1710 may store a large amount of data in the flash memory device.

In some embodiments, the electronic system 1710 further includes an interface 1714 suitable for transmitting and receiving data to and from a communication network. The interface 1714 may be a wired or wireless type. The interface 1714 may include an antenna or a wired or wireless transceiver.

The electronic system 1710 may form or be included by a mobile system, a personal computer, an industrial computer or a logic system performing various functions. The mobile system may be a personal digital assistant (PDA), a portable computer, a tablet computer, a mobile phone, a smart phone, a wireless phone, a laptop computer, a memory card, a digital music system and/or an information transmission/reception system.

In cases where the electronic system 1710 is equipment capable of performing wireless communication, the electronic system 1710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and/or Wibro (wireless broadband Internet).

Figure 33:
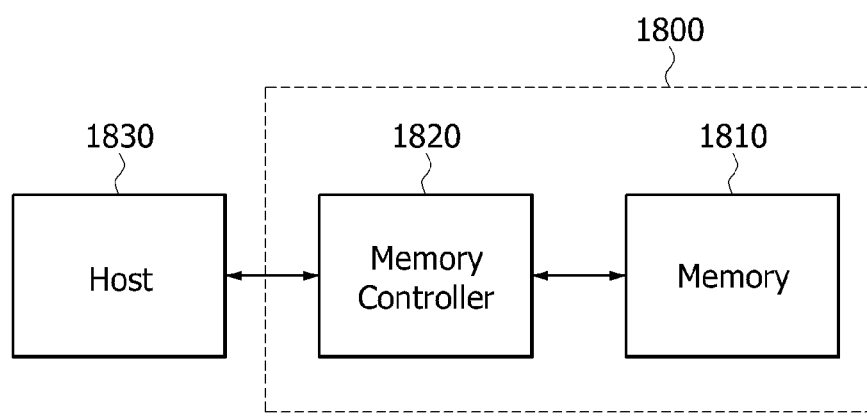
FIG. 33 is a block diagram illustrating another electronic system that includes an embedded package according to some embodiments of the present invention.

Referring to FIG. 33, the embedded packages described herein may be included in or be a memory card 1800. The memory card 1800 may include a memory component 1810, such as a nonvolatile memory device, and a memory controller 1820. The memory component 1810 and the memory controller 1820 may store data or read stored data.

The memory component 1810 may be a memory device that includes one or more of the embedded packages described herein. The memory controller 1820 may control the memory component 1810 such that stored data is read out or data is stored in response to a read/write request from a host 1830.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the technology should be determined by the appended claims and their legal equivalents, not by the above description. All changes coming within the meaning and equivalency range of the appended claims are intended to be embraced therein.

Although a number of embodiments consistent with the technology have been described, it should be understood that numerous other modifications and embodiments can be devised by those skilled in the art that will fall within the spirit and scope of the principles of this disclosure. Particularly, numerous variations and modifications are possible in the component parts and/or arrangements, which are within the scope of the disclosure, the drawings and the accompanying claims. In addition to variations and modifications in the component parts and/or arrangements, alternative uses will also be apparent to those skilled in the art.

What is claimed is:

1. An embedded package comprising:
a core layer, the core layer having a cavity;
a first semiconductor chip disposed in the cavity;
one or more bumps disposed on and directly contacting a top surface of the first semiconductor chip;
a second semiconductor chip disposed over the top surface of the first semiconductor chip;
one or more pads disposed on a top surface of the second semiconductor chip; and
a first insulation layer disposed over the core layer, the first semiconductor chip and the second semiconductor chip,
wherein the first insulation layer includes:
one or more first openings exposing the one or more bumps and having a first depth that corresponds to a distance between a top surface of the first insulation layer and a top surface of the one or more bumps; and
one or more second openings exposing the one or more pads and having a second depth that corresponds to a distance between the top surface of the first insulation layer and a top surface of the one or more pads, the second depth being substantially the same as the first depth,
wherein the top surface of the first insulation layer is over the top surfaces of the bumps and the pads in a direction from the first semiconductor chip to the second semiconductor chip, and
wherein the one or more bumps penetrate the first insulation layer.

2. The embedded package of claim 1, wherein the top surface of the first semiconductor chip is substantially coplanar to a top surface of the core layer.

3. The embedded package of claim 2, wherein a height of the one or more bumps is equal to or greater than a thickness of the second semiconductor chip.

4. The embedded package of claim 1, wherein the second semiconductor chip is disposed over the top surface of the first semiconductor chip such that the one or more bumps are not directly below the second semiconductor chip and the one or more pads are not directly above the first semiconductor chip.

5. The embedded package of claim 4, wherein the second semiconductor chip is disposed over the top surface of the first semiconductor chip in an orientation that is an about 90 degree rotation relative to an orientation of the first semiconductor chip.

6. The embedded package of claim 4, wherein the second semiconductor chip is disposed over the first semiconductor chip such that the one or more pads overlap with the core layer.

7. The embedded package of claim 1, further comprising:
a second insulation layer disposed at a bottom surface of the core layer.

8. An embedded package comprising:
a core layer, the core layer having a cavity;
a first semiconductor chip disposed in the cavity;
one or more first bumps disposed on and directly contacting a top surface of the first semiconductor chip;

a second semiconductor chip disposed over the top surface of the first semiconductor chip;

one or more second bumps disposed on a top surface of the second semiconductor chip; and a first insulation layer disposed over the core layer, the first semiconductor chip and the second semiconductor chip, wherein the first insulation layer includes:

one or more first openings exposing the one or more first bumps and having a first depth that corresponds to a distance between a top surface of the first insulation layer and a top surface of the one or more first bumps; and one or more second openings exposing the second bumps and having a second depth that corresponds to a distance between the top surface of the first insulation layer and a top surface of the one or more second bumps, the second depth being substantially the same as the first depth, wherein the top surface of the first insulation layer is over the top surfaces of the first bumps and the second bumps in a direction from the first semiconductor chip to the second semiconductor chip, and wherein the one or more bumps penetrate the first insulation layer.

9. The embedded package of claim 8, wherein the top surface of the first semiconductor chip is substantially coplanar to a top surface of the core layer.

10. The embedded package of claim 9, wherein a height of the one or more first bumps is different than a height of the one or more second bumps.

11. The embedded package of claim 10, wherein the height of the one or more first bumps is greater than a thickness of the second semiconductor chip.

12. The embedded package of claim 11, wherein the height of the one or more first bumps is substantially equal to a sum of the thickness of the second semiconductor chip and the height of the one or more second bumps.

13. The embedded package of claim 8, wherein the second semiconductor chip is disposed over the top surface of the first semiconductor chip such that the one or more first bumps are not directly below the second semiconductor chip and the one or more second bumps are not directly above the first semiconductor chip.

14. The embedded package of claim 13, wherein the second semiconductor chip is disposed over the top surface of the first semiconductor chip in an orientation that is an about 90 degree rotation relative to an orientation of the first semiconductor chip.

15. The embedded package of claim 13, wherein the second semiconductor chip is disposed over the first semiconductor chip such that the one or more second bumps overlap with the core layer.

16. The embedded package of claim 8, further comprising:

a second insulation layer disposed at a bottom surface of the core layer.

* * * * *